(12) United States Patent
Jo et al.

(10) Patent No.: US 11,887,913 B2
(45) Date of Patent: Jan. 30, 2024

(54) INTEGRATED CIRCUIT DEVICE AND SEMICONDUCTOR PACKAGE INCLUDING THE SAME

(71) Applicant: Samsung Electronics Co., Ltd., Suwon-si (KR)

(72) Inventors: Chajea Jo, Yongin-si (KR); Ohguk Kwon, Anyang-si (KR); Namhoon Kim, Gunpo-si (KR); Hyoeun Kim, Cheonan-si (KR); Seunghoon Yeon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/066,487

(22) Filed: Dec. 15, 2022

(65) Prior Publication Data

US 2023/0117072 A1 Apr. 20, 2023

Related U.S. Application Data

(63) Continuation of application No. 17/162,418, filed on Jan. 29, 2021, now Pat. No. 11,545,417.

(30) Foreign Application Priority Data

Jun. 30, 2020 (KR) .................... 10-2020-0080502

(51) Int. Cl.
| | |
|---|---|
| *H01L 23/48* | (2006.01) |
| *H01L 25/065* | (2023.01) |
| *H01L 21/768* | (2006.01) |
| *H01L 23/00* | (2006.01) |

(52) U.S. Cl.
CPC ...... *H01L 23/481* (2013.01); *H01L 21/76898* (2013.01); *H01L 23/562* (2013.01); *H01L 24/05* (2013.01); *H01L 24/13* (2013.01); *H01L 25/0652* (2013.01); *H01L 2224/05008* (2013.01); *H01L 2224/05025* (2013.01); *H01L 2224/13026* (2013.01); *H01L 2225/06513* (2013.01); *H01L 2225/06541* (2013.01);
(Continued)

(58) Field of Classification Search
CPC ................................................... H01L 23/481
See application file for complete search history.

(56) References Cited

U.S. PATENT DOCUMENTS

| | | |
|---|---|---|
| 8,106,520 B2 | 1/2012 | Keeth et al. |
| 8,193,039 B2 | 6/2012 | Su et al. |
| 8,759,950 B2 | 6/2014 | Kamgaing et al. |

(Continued)

*Primary Examiner* — William A Harriston
(74) *Attorney, Agent, or Firm* — Harness, Dickey & Pierce, P.L.C.

(57) ABSTRACT

An integrated circuit device includes a semiconductor substrate, first through-silicon-via (TSV) structures penetrating a first region of the semiconductor substrate and spaced apart from each other by a first pitch, a first individual device between the first TSV structures and spaced apart from the first TSV structures by a distance that is greater than a first keep-off distance, and second TSV structures penetrating a second region of the semiconductor substrate and spaced apart from each other by a second pitch that is less than the first pitch. The second region of the semiconductor device does not include an individual device that is homogeneous with the first individual device and between the second TSV structures.

20 Claims, 20 Drawing Sheets

(52) U.S. Cl.
CPC .............. *H01L 2225/06586* (2013.01); *H01L 2225/06589* (2013.01); *H01L 2924/351* (2013.01)

(56) References Cited

U.S. PATENT DOCUMENTS

| | | | |
|---|---|---|---|
| 9,087,822 | B2 | 7/2015 | Furuta et al. |
| 9,396,300 | B2 | 7/2016 | Wang et al. |
| 9,508,665 | B2 | 11/2016 | Beyne et al. |
| 9,640,490 | B2 | 5/2017 | Hsieh et al. |
| 10,141,244 | B2 | 11/2018 | Zhang et al. |
| 2012/0104561 | A1* | 5/2012 | Kuo ................ H01L 23/481 257/621 |
| 2013/0187275 | A1 | 7/2013 | Ohira |
| 2015/0179547 | A1* | 6/2015 | Hong ............ H01L 21/76898 257/774 |
| 2015/0228555 | A1 | 8/2015 | Rabie et al. |
| 2018/0068978 | A1* | 3/2018 | Jeng ................ H01L 25/50 |
| 2021/0098380 | A1* | 4/2021 | Chen ............... H01L 21/565 |
| 2023/0005820 | A1* | 1/2023 | Davis ............... H01L 24/14 |
| 2023/0144206 | A1* | 5/2023 | Dogiamis ......... H01L 25/0652 257/774 |

* cited by examiner

INTEGRATED CIRCUIT DEVICE AND SEMICONDUCTOR PACKAGE INCLUDING THE SAME

CROSS-REFERENCE TO RELATED APPLICATION

This application is a continuation of U.S. application Ser. No. 17/162,418, filed on Jan. 29, 2021, which is based on and claims priority under 35 U.S.C. § 119 to Korean Patent Application No. 10-2020-0080502, filed on Jun. 30, 2020 in the Korean Intellectual Property Office, the disclosures of each of which are incorporated by reference herein in their entirety.

BACKGROUND

Inventive concepts relate to an integrated circuit device and/or a semiconductor package including the same, and more particularly, to an integrated circuit device including a through-silicon-via (TSV) and/or a semiconductor package including the integrated circuit device.

With active development of a three-dimensional (3D) package, in which a plurality of semiconductor chips are mounted in one semiconductor package, TSV technologies forming electrical connections in a vertical direction by penetrating a substrate or a die have been recognized as highly important. In order to stably operate the 3D package, a TSV structure may be required to have a dimension (for example, a diameter) greater than or equal to a desired and/or alternatively predetermined dimension.

SUMMARY

Inventive concepts provide an integrated circuit device including a through-silicon-via (TSV) structure and/or a semiconductor package including the integrated circuit device.

According to an example embodiment of inventive concepts, an integrated circuit device may include a semiconductor substrate, first through-silicon-via (TSV) structures penetrating a first region of the semiconductor substrate, a first individual device between the first TSV structures, and second TSV structures penetrating a second region of the semiconductor substrate. The first TSV structures may be spaced apart from each other by a first pitch. The first individual device may be spaced apart from the first TSV structures by a distance that is greater than a first keep-off distance. The second TSV structures may be spaced apart from each other by a second pitch that is less than the first pitch. The second region of the semiconductor substrate may not include an individual device that is homogeneous with the first individual device and between the second TSV structures.

According to an example embodiment of inventive concepts, a semiconductor package may include a package substrate, a first integrated circuit device on the package substrate, and a second integrated circuit device on the first integrated circuit device. The first integrated circuit device may include a first through-silicon-via (TSV) region and a second TSV region. The first TSV region may include first TSV structures and first individual devices. The second TSV region may include second TSV structures. The second integrated circuit device may be electrically connected to the first TSV structures and the second TSV structures. The first TSV region may include a keep-off zone defined as a region in which property changes of the first individual device and an individual device, caused by stress occurring around the first TSV structures in response to a voltage applied to the first TSV structures, may be greater than a threshold value. The individual device may be homogeneous with the first individual device. The keep-off zone may be within a first keep-off distance from a side wall of each of the first TSV structures. A distance between adjacent first TSV structures, among the first TSV structures, may be greater than twice the first keep-off distance. A distance between adjacent second TSV structures, among the second TSV structure, may be equal to or less than twice the first keep-off distance.

According to an example embodiment of inventive concepts, a semiconductor package may include a package substrate, a first integrated circuit device on the package substrate, a second integrated circuit device on the package substrate and spaced apart from the first integrated circuit device in a horizontal direction, and a third integrated circuit device on the first integrated circuit device and the second integrated circuit device. The first integrated circuit device may include first through-silicon-via (TSV) structures and a first individual device. The first TSV structures may be spaced apart from each other by a first pitch. The first individual device may be between the first TSV structures. The second integrated circuit device may include second TSV structures spaced apart from each other by a second pitch that is less than the first pitch. The second pitch may be equal to or less than about 15 μm. The second integrated circuit device may not include an individual device that is homogeneous with the first individual device and between the second TSV structures. The third integrated circuit device may be electrically connected to the first TSV structures and the second TSV structures.

BRIEF DESCRIPTION OF THE DRAWINGS

Embodiments of inventive concepts will be more clearly understood from the following detailed description taken in conjunction with the accompanying drawings in which.

DETAILED DESCRIPTION OF THE EMBODIMENTS

Figure 1:
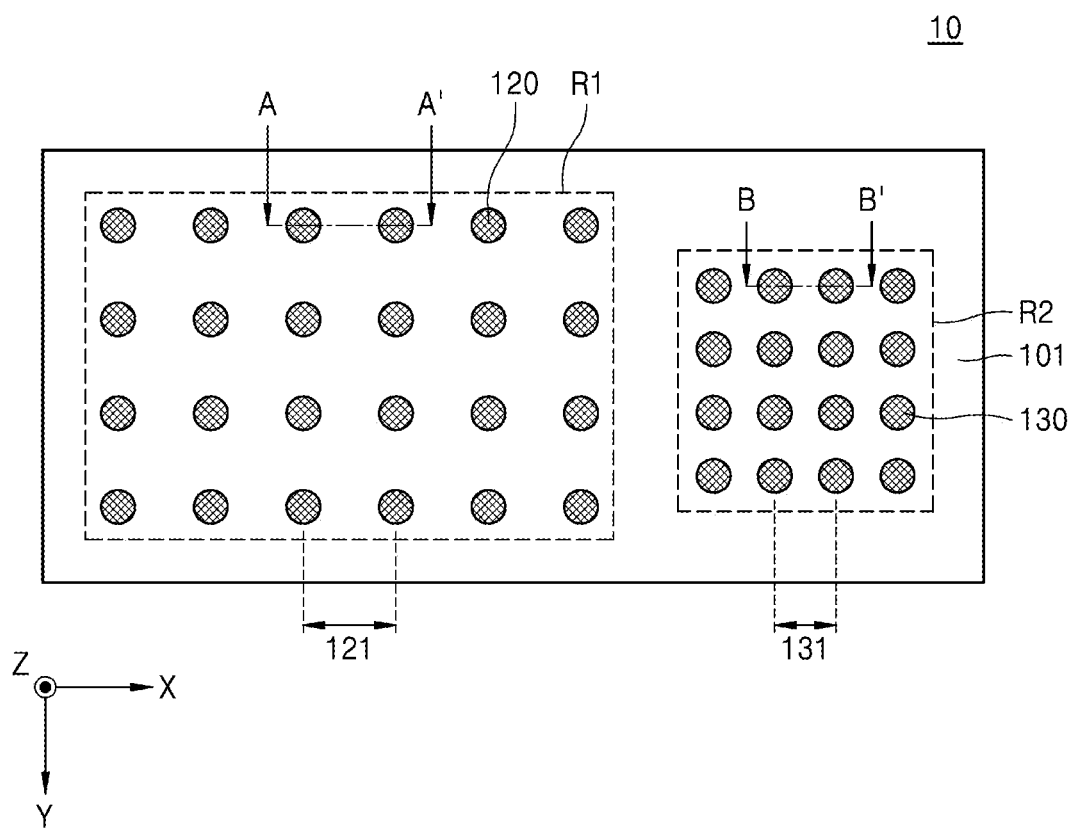
FIG. 1 is a schematic plan view of arrangements of first through-silicon-via (TSV) structures and second TSV structures of an integrated circuit device, according to example embodiments of inventive concepts.

Hereinafter, embodiments of inventive concepts will be described in detail by referring to the accompanying drawings. Like reference numerals will be used for like elements in the drawings, and repeated descriptions thereof will not be given.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 2:
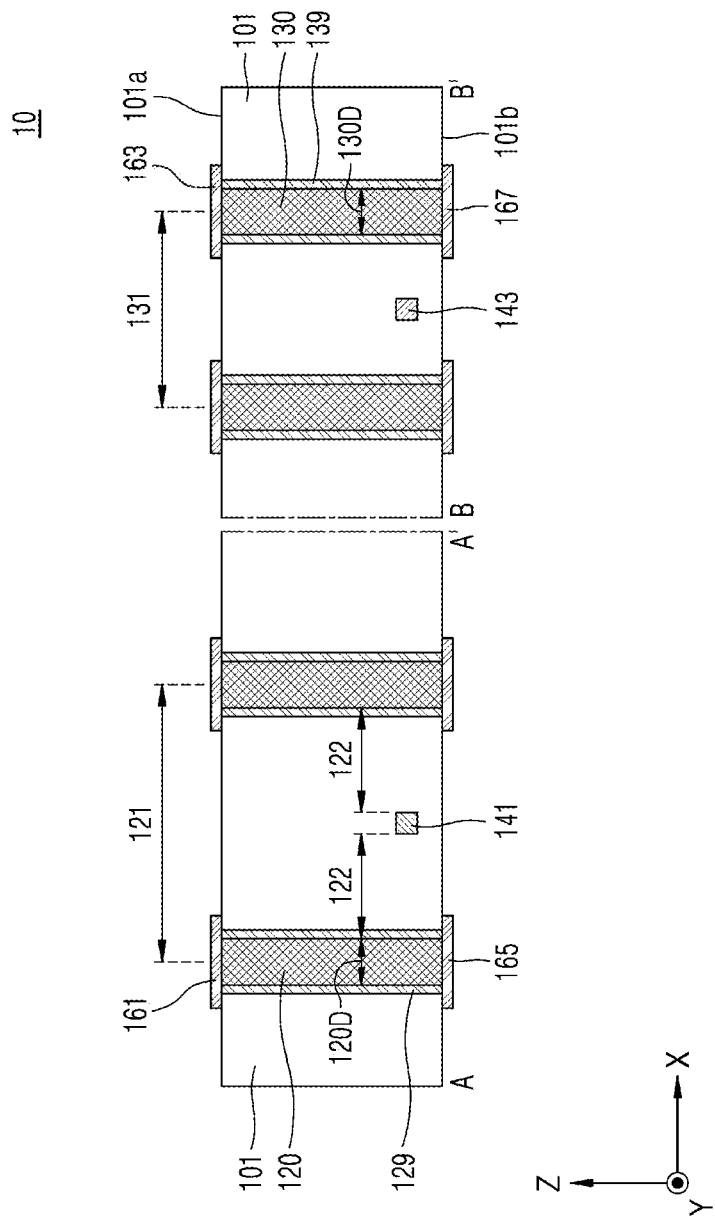
FIG. 2 is a cross-sectional view of an integrated circuit device of FIG. 1, which is shown along line A-A' and line B-B' of FIG. 1.

FIG. 1 is a schematic plan view of arrangements of first through-silicon-via (TSV) structures 120 and second TSV structures 130 of an integrated circuit device 10, according to example embodiments of inventive concepts. FIG. 2 is a cross-sectional view of the integrated circuit device 10 of FIG. 1, which is shown along line A-A' and line B-B' of FIG. 1.

Referring to FIGS. 1 and 2, the integrated circuit device 10 may include a semiconductor structure 101, the plurality of first TSV structures 120 arranged in a first TSV region R1 of the semiconductor structure 101 and the plurality of second TSV structures 130 arranged in a second TSV region R2 of the semiconductor structure 101.

As illustrated in FIG. 1, the plurality of first TSV structures 120 may be arranged as a two-dimensional array in the first TSV region R1 of the semiconductor structure 101, and the plurality of second TSV structures 130 may be arranged as a two-dimensional array in the second TSV region R2 of the semiconductor structure 101.

According to example embodiments, a density of the plurality of second TSV structures 130 arranged in the second TSV region R2 may be greater than a density of the plurality of first TSV structures 120 arranged in the first TSV region R1. For example, a distance between centers of adjacent first TSV structures 120 may be defined as a first TSV pitch 121, and a distance between centers of adjacent second TSV structures 130 may be defined as a second TSV pitch 131. In this case, the second TSV pitch 131 may be less than the first TSV pitch 121.

The first TSV structure 120 may at least partially penetrate the semiconductor structure 101. For example, the first TSV structure 120 may extend from a lower surface 101b of the semiconductor structure 101 to an upper surface 101a of the semiconductor structure 101 in a vertical direction to penetrate the semiconductor structure 101, wherein the upper surface 101a and the lower surface 101b may also be referred to as a first surface 101a and a second surface 101b, respectively. A first via insulating layer 129 may be between the first TSV structure 120 and the semiconductor structure 101. The first TSV structure 120 may include a first conductive plug having a cylindrical shape penetrating the semiconductor structure 101 and a first conductive barrier layer surrounding the first conductive plug. The first conductive barrier layer may have a cylindrical shape surrounding the first conductive plug. For example, the first conductive plug of the first TSV structure 120 may include Cu or W. For example, the first conductive barrier layer of the first TSV structure 120 may include at least one material selected from Ti, TiN, Ta, TaN, Ru, Co, Mn, WN, Ni, or NiB.

A metal of the first TSV structure 120 and a semiconductor substrate (110 of FIG. 3) included in the semiconductor structure 101 may have different thermal expansion coefficients from each other. In this case, when a temperature change is caused in the integrated circuit device 10 due to a voltage, etc. applied to the first TSV structure 120, the first TSV structure 120 may apply thermal stress or physical stress to the semiconductor substrate around thereto, due to the different thermal expansion coefficients. Damage may occur to the semiconductor substrate, due to the stress applied to the semiconductor substrate around the first TSV structure 120. Also, the stress caused around the first TSV structures 120 may cause a property change of an individual device around the first TSV structures 120. For example, the stress caused around the first TSV structures 120 may change an electron mobility in the individual device so as to cause the property change of the individual device.

A first keep-off zone may be provided in the first TSV region R1, the first keep-off zone prohibiting an arrangement of an individual device (for example, an active device), a property of which is changed, due to the stress caused by the different thermal expansion coefficients between the first TSV structure 120 and the semiconductor substrate. According to cases, the keep-off zone may also be referred to as a keep-out zone.

According to example embodiments, the first keep-off zone may be defined as a region in which a property change of an individual device, the property change being caused by stress occurring around the first TSV structures 120 when a voltage is applied to the first TSV structures, is greater than a desired and/or alternatively predetermined threshold value. For example, the first keep-off zone may be defined as a region in which a change in an electron mobility in an individual device, the change being caused by the stress occurring around the first TSV structures 120 when a voltage is applied to the first TSV structures 120, is greater than a desired and/or alternatively predetermined threshold value. For example, the first keep-off zone may be defined as the region in which the change in the electron mobility in the individual device, the change being caused by the stress occurring around the first TSV structures 120 when the voltage is applied to the first TSV structures 120, deviates from a range of about −5% to about +5%. According to example embodiments, the first keep-off zone may be defined as a region in which an intensity of an electric field generated by the voltage applied to the first TSV structures is greater than a desired and/or alternatively predetermined threshold value.

A first individual device 141 may be arranged in the first TSV region R1. While the first individual device 141 may be arranged between the first TSV structures 120, the first individual device 141 may be apart from the first keep-off zone set around each of the first TSV structures 120. The first individual device 141 may include a device, which has a property change due to stress caused around the first TSV structures, when the first individual device 141 is located in the keep-off zone. Alternatively, the first individual device 141 may include a device, which does not have a property change due to stress caused around the first TSV structures, when the first individual device 141 is located in the keep-off zone.

According to example embodiments, the first keep-off zone may be defined as a region within a first keep-off distance 122 from a side wall of the first TSV structure 120. According to example embodiments, when a diameter 120D of the first TSV structure 120 is about 4 μm, the first keep-off distance 122 may be equal to or greater than about 5 μm and equal to or less than about 10 μm.

According to example embodiments, the first TSV pitch 121 of the plurality of first TSV structures 120 may be at least greater than a value generated by summing the diameter 120D of the first TSV structure 120 with twice the first keep-off distance 122. According to example embodiments, the first pitch 121 of the first plurality of first TSV structures 120 may be greater than about 15 μm.

The second TSV structure 130 may at least partially penetrate the semiconductor structure 101. For example, the second TSV structure 130 may extend from the lower surface 101b of the semiconductor structure 101 to the upper surface 101a of the semiconductor structure 101 in the vertical direction to penetrate the semiconductor structure 101. A second via insulating layer 139 may be between the second TSV structure 130 and the semiconductor structure 101. The second TSV structure 130 may include a second conductive plug having a cylindrical shape penetrating the semiconductor structure 101 and a second conductive barrier layer surrounding the second conductive plug. The second conductive plug and the second conductive barrier layer of the second TSV structure 130 may have the same or substantially the same characteristics as the first conductive plug and the first conductive barrier layer of the first TSV structure 120 described above.

According to example embodiments, the second TSV structure 130 may have the same dimension as the first TSV structure 120. For example, the second TSV structure 130 and the first TSV structure 120 may have the same diameter and the same aspect ratio. For example, a diameter 130D of the second TSV structure 130 and the diameter 120D of the first TSV structure 120 may be between about 2 μm and about 6 μm. For example, the aspect ratio of the second TSV structure 130 and the first TSV structure 120 may be between about 5 and about 20. When the second TSV structure 130 has the same dimension as the first TSV structure 120, a second keep-off zone provided around the second TSV structure 130 may be set as the same size as the first keep-off zone. In the second keep-off zone, the arrangement of an individual device may be prohibited, the individual device having a property change caused by stress occurring due to different thermal expansion coefficients between the second TSV structure 130 and the semiconductor substrate.

According to example embodiments, an individual device, which has a property change due to stress caused around the second TSV structures 130, may not be arranged in the second TSV region R2. According to example embodiments, an individual device, which is like the first individual devices 141 arranged in the first TSV region R1, may not be arranged between the second TSV structures 130. In other words, an individual device, which is homogeneous with the first individual devices 141 arranged in the first TSV region R1, may not be arranged between the second TSV structures 130. In this case, there may be no issue about the property change of an individual device, the property change being caused by the stress occurring around the second TSV structures 130, and thus, the plurality of second TSV structures 130 may be arranged in the second TSV region R2 by having a much less distance therebetween, compared to the plurality of first TSV structures 120.

The individual device, which has the property change due to the stress, may not be arranged between adjacent second TSV structures 130, and thus, the second TSV pitch 131 of the plurality of second TSV structures 130 may be set to be substantially little. According to example embodiments, the second TSV pitch 131 of the plurality of second TSV structures 130 may be less than the first TSV pitch 121 of the plurality of first TSV structures 120. For example, the second TSV pitch 131 of the plurality of second TSV structures 130 may be equal to or less than about 15 μm. According to example embodiments, the second TSV pitch 131 of the plurality of second TSV structures 130 may be equal to or less than a value generated by summing the diameter 120D of the first TSV structure 120 with twice the first keep-off distance 122.

According to example embodiments, a distance between side walls of adjacent second TSV structures 130 may be equal to or less than twice the first keep-off distance 122.

According to example embodiments, the distance between the side walls of the adjacent second TSV structures 130 may be equal to or greater than about 2 μm and equal to or less than about 11 μm. When the distance between the side walls of the adjacent second TSV structures 130 is less than about 2 μm, distances between the second TSV structures 130 may be little, and thus, the second TSV structures 130 may unnecessarily contact each other. When the distance between the side walls of the adjacent second TSV structures 130 is greater than about 11 μm, the effect of a reduced size of the integrated circuit device 10, which is obtained by not arranging the individual device having the property change, in the second TSV region R2 may be little.

According to example embodiments, a second individual device 143 may be arranged in the second TSV region R2. The second individual device 143 may include a device having little or almost no property change caused by stress occurring around the second TSV structures 130 when a voltage is applied to the second TSV structures 130. For example, the second individual device 143 may include a passive device, such as a capacitor. The second individual device 143 may be arranged between adjacent second TSV structures 130. The second individual device 143 may be arranged to be adjacent to the second TSV structure 130, for example, within a distance corresponding to the first keep-off distance 122 from the second TSV structure 130.

First upper connection pads 161 electrically connected to the first TSV structures 120 and second upper pads 163 electrically connected to the second TSV structures 130 may be arranged on the first surface 101a of the semiconductor structure 101. For example, the first upper connection pads 161 and the second upper connection pads 163 may include metal.

First lower conductors 165 electrically connected to the first TSV structures 120 and second lower conductors 167 electrically connected to the second TSV structures 130 may be arranged on the second surface 101b of the semiconductor structure 101, the second surface 101b being opposite to the first surface 101a.

According to example embodiments of inventive concepts, the integrated circuit device 10 may have a desired and/or alternatively predetermined region in which no device is arranged that is affected by stress applied around the TSV structures, or a device having almost no effect from the stress is arranged, wherein the TSV structures may be arranged in the desired and/or alternatively predetermined region to have a substantially small distance therebetween. Accordingly, the number of TSV structures which may be arranged within a limited area may be increased. As a result, the integrated circuit device 10, which has a small form factor and at the same time is capable of high speed signal transmission, may be provided.

Figure 3:
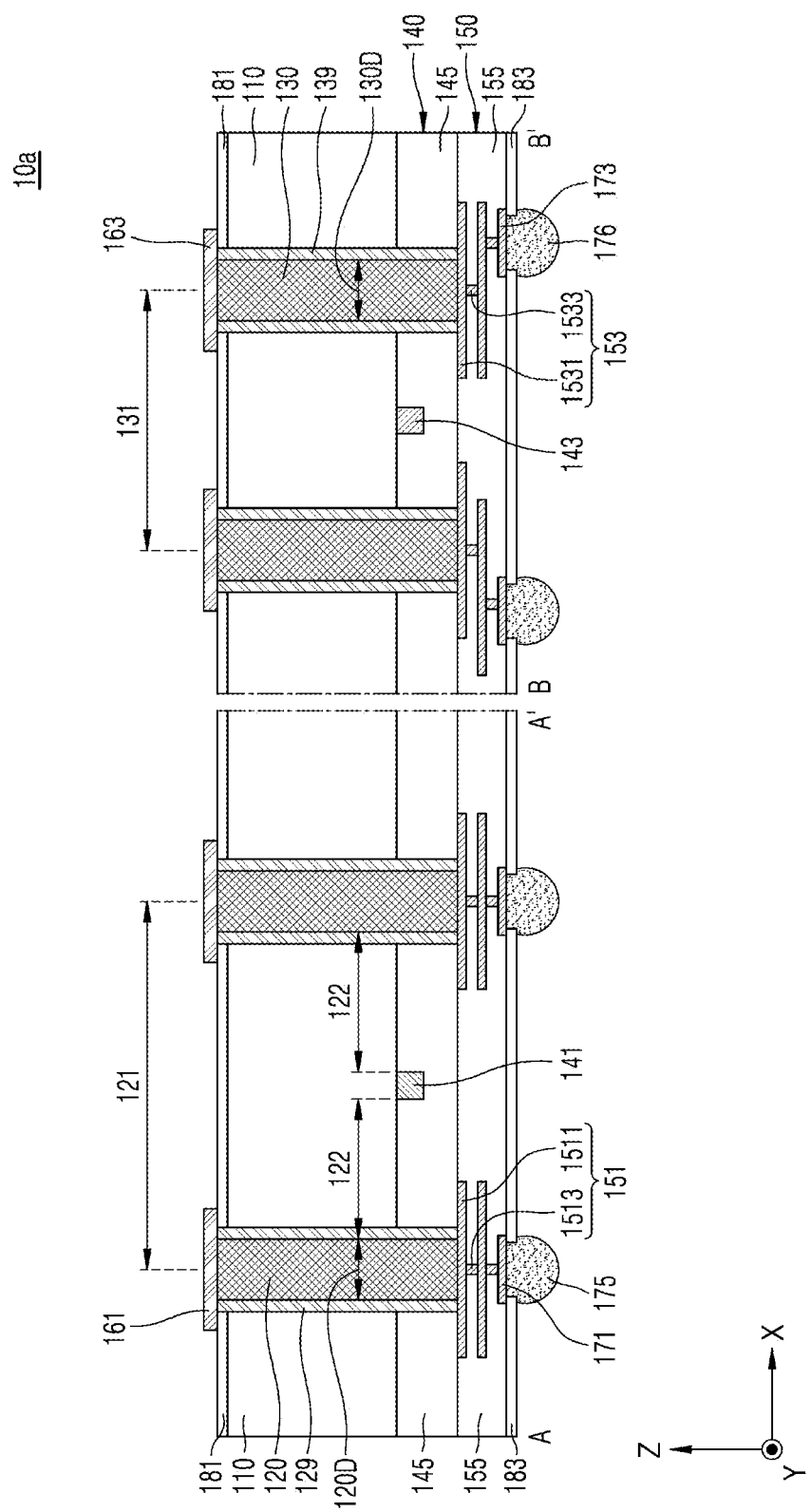
FIG. 3 is a cross-sectional view of an integrated circuit device according to example embodiments of inventive concepts.

FIG. 3 is a cross-sectional view of an integrated circuit device 10a according to example embodiments of inventive concepts. Hereinafter, descriptions will be given based on aspects of the integrated circuit device 10a, which are different from the aspects of the integrated circuit device 10 described with reference to FIGS. 1 and 2.

Referring to FIG. 3, the integrated circuit device 10a may include the semiconductor substrate 110, a front-end-of-line (FEOL) structure 140, and a back-end-of-line (BEOL) structure 150. The first TSV structure 120 may be arranged in the first TSV region (R1 of FIG. 1) of the semiconductor substrate 110 and may penetrate the semiconductor substrate 110 and the FEOL structure 140. The first via insulating layer 129 may be between the semiconductor substrate 110 and the first TSV structure 120 and between the FEOL structure 140 and the first TSV structure 120. The second TSV structure 130 may be arranged in the second TSV region (R2 of FIG. 1) of the semiconductor substrate 110 and may penetrate the semiconductor substrate 110 and the FEOL structure 140. The second via insulating layer 139 may be between the semiconductor substrate 110 and the second TSV structure 130 and between the FEOL structure 140 and the second TSV structure 130.

The semiconductor substrate 110 may include a semiconductor wafer. The semiconductor substrate 110 may include, for example, silicon (Si). Alternatively, the semiconductor substrate 110 may include a semiconductor element, such as germanium (Ge), or a compound semiconductor, such as silicon carbide (SiC), gallium arsenide (GaAs), indium arsenide (InAs), and indium phosphide (InP). The semiconductor substrate 110 may include a conductive region, for example, a well doped with impurities or a structure doped with impurities. Also, the semiconductor substrate 110 may have various device isolation structures, such as a shallow trench isolation (STI) structure.

The FEOL structure 140 may be arranged on a lower surface of the semiconductor substrate 110. The FEOL structure 140 may include various types of a plurality of individual devices and interlayer insulating layers 145. The plurality of individual devices may include various microelectronic devices, for example, a metal-oxide-semiconductor field-effect transistor (MOSFET), system large scale integration (LSI), an image sensor, such as a complementary metal-oxide-semiconductor (CMOS) imaging sensor (CIS), a micro-electro-mechanical system (MEMS), an active device, a passive device, and the like. The plurality of individual devices may be electrically connected to the conductive region of the semiconductor substrate 110. Also, adjacent individual devices from among the plurality of individual devices may be electrically isolated from each other via the interlayer insulating layers 145.

The FEOL structure 140 may include the first individual devices 141 arranged in the first TSV region (R1 of FIG. 1) and the second individual devices 143 arranged in the second TSV region (R2 of FIG. 1). At least one of the first individual devices 141 may be electrically connected to the first TSV structures 120, and at least one of the second individual devices 143 may be electrically connected to the second TSV structures 130.

The first individual devices 141 may correspond to devices, properties of which are changed due to stress caused around the first TSV structures 120 when a voltage is applied to the first TSV structures 120. According to example embodiments, the first individual devices 141 may include active devices. For example, the first individual devices 141 may include an n-type metal-oxide-semiconductor (NMOS), a p-type metal-oxide-semiconductor (PMOS), and the like. In order to limit and/or prevent a property change due to stress caused around the first TSV structures 120, the first individual device 141 may be arranged between the first TSV structures and may be arranged to be apart from a side wall of each of the first TSV structures 120 by a distance that is greater than the first keep-off distance 122.

The second individual devices 143 may include devices having little or almost no property changes caused by stress occurring around the second TSV structures 130 when a voltage is applied to the second TSV structures 130. According to example embodiments, the second individual devices 143 may include passive devices, such as capacitors.

According to other example embodiments, no individual device may be arranged between the second TSV structures 130. In this case, at least one of the second TSV structures 130 may be electrically connected to an individual device provided in another region of the semiconductor substrate 110, the other region being apart from the second TSV region (R2 of FIG. 1). For example, the at least one of the second TSV structures 130 may be electrically connected to the BEOL structure 150 of the individual device provided in the other region of the semiconductor substrate 110, via a multi-layer interconnect structure.

The BEOL structure 150 may include multi-layer interconnect structures and a metal interlayer insulating layer 155 insulating the multi-layer interconnect structures from one another. Each of the multi-layer interconnect structures may include a plurality of metal interconnect layers and a plurality of contact plugs. According to example embodiments, the BEOL structure 150 may include a first multi-layer interconnect structure 151 connected to the first TSV structure 120 and a second multi-layer interconnect structure 153 connected to the second TSV structure 130. The first multi-layer interconnect structure 151 may include metal interconnect layers 1511 and contact plugs 1513, and the second multi-layer interconnect structure 153 may include metal interconnect layers 1531 and contact plugs 1533. A lower surface of the first TSV structure 120 may be connected to one of the metal interconnect layers 1511 of the first multi-layer interconnect structure 151, and a lower surface of the second TSV structure 130 may be connected to one of the metal interconnect layers 1531 of the second multi-layer interconnect structure 153. Each of the first multi-layer interconnect structure 151 and the second multi-layer interconnect structure 153 may be electrically connected to the individual devices provided in the FEOL structure 140.

A lower protection layer 183 may be arranged on the metal interlayer insulating layer 155. The lower protection layer 183 may include a Si oxide layer, a Si nitride layer, a polymer, or a combination thereof. The lower protection layer 183 may include a first opening exposing a first connection pad 171 connected to the first multi-layer interconnect structure 151 and a second opening exposing a second connection pad 173 connected to the second multi-layer interconnect structure 153. The first connection pad 171 may be connected to a first lower connection bump 175 through the first opening, and the second connection pad 173 may be connected to a second lower connection bump 176 through the second opening. According to example embodiments, a distance between adjacent first lower connection bumps 175 may be the same as a distance between adjacent second lower connection bumps 176. According to necessity, the first lower connection bumps 175 and the second lower connection bumps 176 may be omitted.

An upper protection layer 181 may be arranged on an upper surface of the semiconductor substrate 110. The upper protection layer 181 may include a Si oxide layer, a Si nitride layer, a polymer, or a combination thereof. The first upper connection pad 161 connected to the first TSV structure 120 and the second upper connection pad 163 connected to the second TSV structure 130 may be arranged on the upper protection layer 181. The first upper connection pad 161 may be connected to the first TSV structure 120 penetrating the upper protection layer 181, and the second upper connection pad 163 may be connected to the second TSV structure 130 penetrating the upper protection layer 181.

According to example embodiments, a distance between adjacent first upper connection pads 161 may be greater than a distance between adjacent second upper connection pads 163. For example, the first upper connection pads 161 may be arranged to be apart from each other by a pitch that is the same as the first TSV pitch 121 of the first TSV structures 120, and the second upper connection pads 163 may be arranged to be apart from each other by a pitch that is the same as the second TSV pitch 131 of the second TSV structures 130.

Each of processes of forming the BEOL structure 150, the lower protection layer 183, the first lower connection bump 175, the second lower connection bump 176, the first upper connection pad 161, and the second upper connection pad 163 may be performed after the first TSV structures 120 and the second TSV structures 130 are formed.

Figure 4:
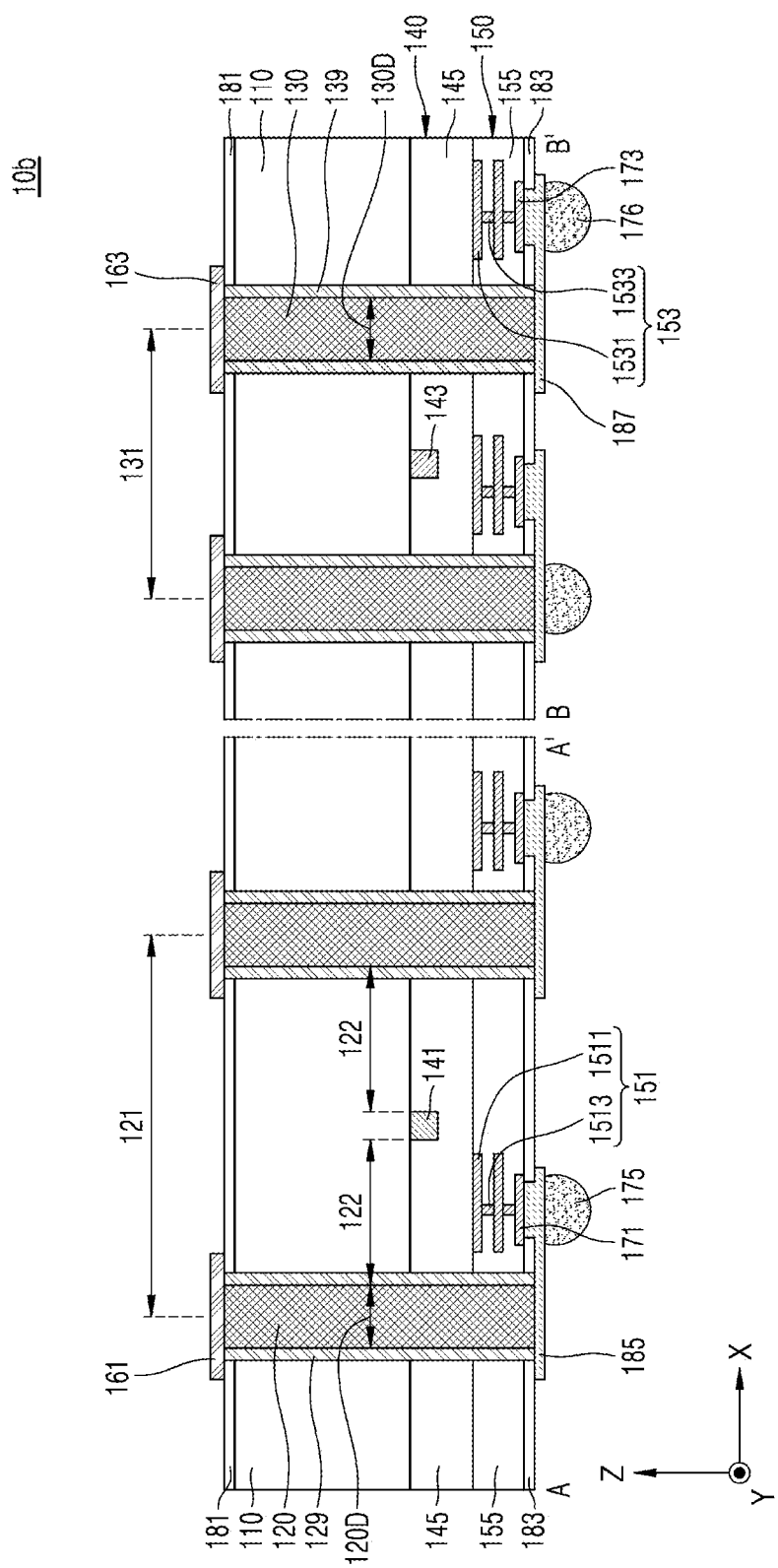
FIG. 4 is a cross-sectional view of an integrated circuit device according to example embodiments of inventive concepts.

FIG. 4 is a cross-sectional view of an integrated circuit device 10b according to example embodiments of inventive concepts. Hereinafter, descriptions will be given based on aspects of the integrated circuit device 10b, which are different from the aspects of the integrated circuit device 10a described with reference to FIG. 3.

Referring to FIG. 4, the first TSV structures 120 and the second TSV structures 130 may be formed after the FEOL structure 140 and the BEOL structure 150 are formed. Thus, the first TSV structures 120 and the second TSV structures 130 may be formed to penetrate the semiconductor substrate 110, the interlayer insulating layer 145 of the FEOL structure 140, and the metal interlayer insulating layer 155 of the BEOL structure 150.

A first redistribution connection pattern 185 connecting the first TSV structure 120 with the first lower connection bump 175 may be formed on the BEOL structure 150. The first TSV structure 120 may penetrate the lower protection layer 183 and may be connected to the first redistribution connection pattern 185, and may be connected to the first connection pad 171 through the first redistribution connection pattern 185. Also, a second redistribution connection pattern 187 connecting the second TSV structure 130 with the second lower connection bump 176 may be formed on the BEOL structure 150. The second TSV structure 130 may penetrate the lower protection layer 183 and may be connected to the second redistribution connection pattern 187, and may be connected to the second connection pad 173 through the second redistribution connection pattern 187.

Figure 5:
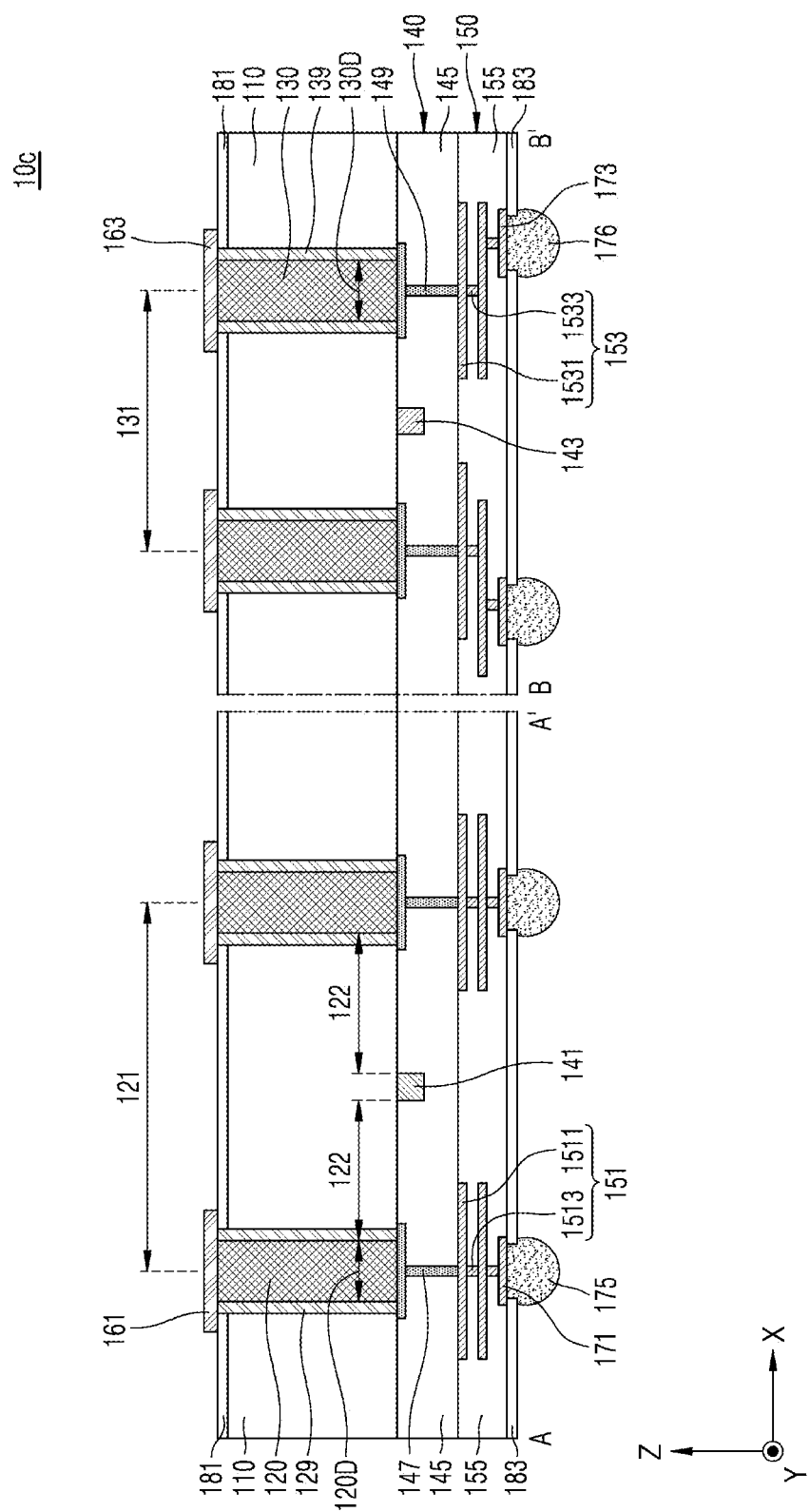
FIG. 5 is a cross-sectional view of an integrated circuit device according to example embodiments of inventive concepts.

FIG. 5 is a cross-sectional view of an integrated circuit device 10c according to example embodiments of inventive concepts. Hereinafter, descriptions will be given based on aspects of the integrated circuit device 10c, which are different from the aspects of the integrated circuit device 10a described with reference to FIG. 3.

Referring to FIG. 5, the first TSV structures 120 and the second TSV structures 130 may be formed to penetrate the semiconductor substrate 110. After forming the first TSV structures 120 and the second TSV structures 130, the FEOL structure 140 and the BEOL structure 150 may be sequentially formed on the lower surface of the semiconductor substrate 110. The first TSV structures 120 may be connected to the first multi-layer interconnect structure 151 of the BEOL structure 150 through a connection structure 147 in the FEOL structure 140, and the second TSV structures 130 may be connected to the second multi-layer interconnect structure 153 of the BEOL structure 150 through a connection structure 149 in the FEOL structure 140.

Figure 6:
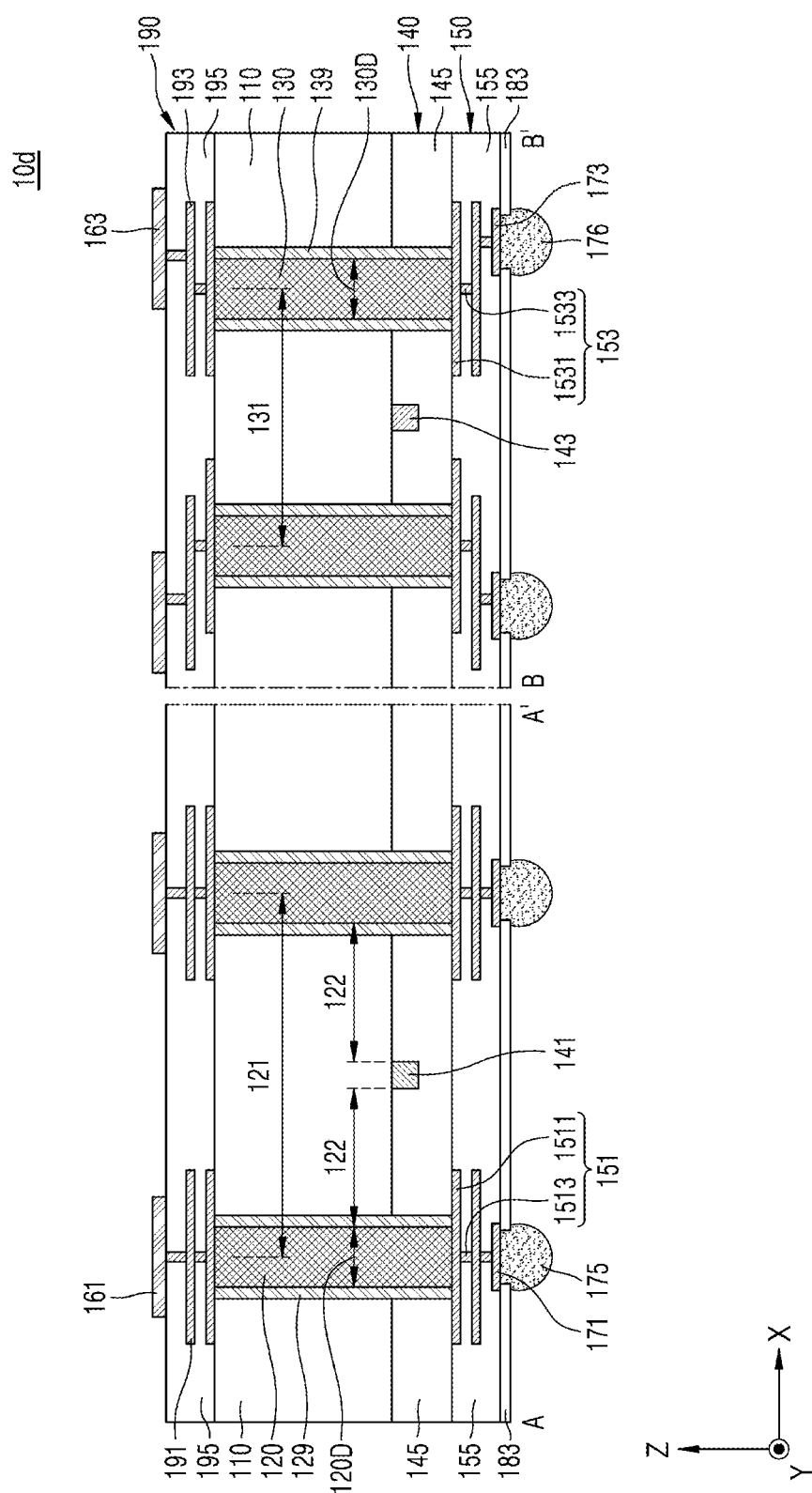
FIG. 6 is a cross-sectional view of an integrated circuit device according to example embodiments of inventive concepts.

FIG. 6 is a cross-sectional view of an integrated circuit device 10d according to example embodiments of inventive concepts.

The integrated circuit device 10d illustrated in FIG. 6 may be substantially the same as or similar to the integrated circuit device 10a illustrated in FIG. 3, except for that the integrated circuit device 10d further includes a redistribution structure 190. Hereinafter, descriptions will be given based on aspects of the integrated circuit device 10d, which are different from the aspects of the integrated circuit device 10a described with reference to FIG. 3.

Referring to FIG. 6, the integrated circuit device 10d may include the redistribution structure 190 arranged on an upper surface of the semiconductor substrate 110. The redistribution structure 190 may include redistribution patterns and a redistribution insulating layer 195 insulating the redistribution patterns. The redistribution insulating layer 195 may be formed to cover the upper surface of the semiconductor substrate 110. For example, the redistribution structure 190 may include a first redistribution pattern 191 connected to the first TSV structure 120 and a second redistribution pattern 193 connected to the second TSV structure 130. The first redistribution pattern 191 and the second redistribution pattern 193 may include a plurality of redistribution line patterns and a plurality of redistribution via patterns. The plurality of redistribution line patterns may be apart from each other in a vertical direction, and the plurality of redistribution line patterns may be electrically connected to each other via the plurality of redistribution via patterns.

The first upper connection pads 161 connected to the first TSV structures 120 through the first redistribution pattern 191 and the second upper pads 163 connected to the second TSV structures 130 through the second redistribution pattern 193 may be arranged on the redistribution structure 190. According to example embodiments, a distance between the second upper connection pads 163 may be greater than a distance between the second TSV structures 130. According to example embodiments, a distance between the first upper connection pads 161 and the distance between the second upper connection pads 163 may be the same.

Figure 7:
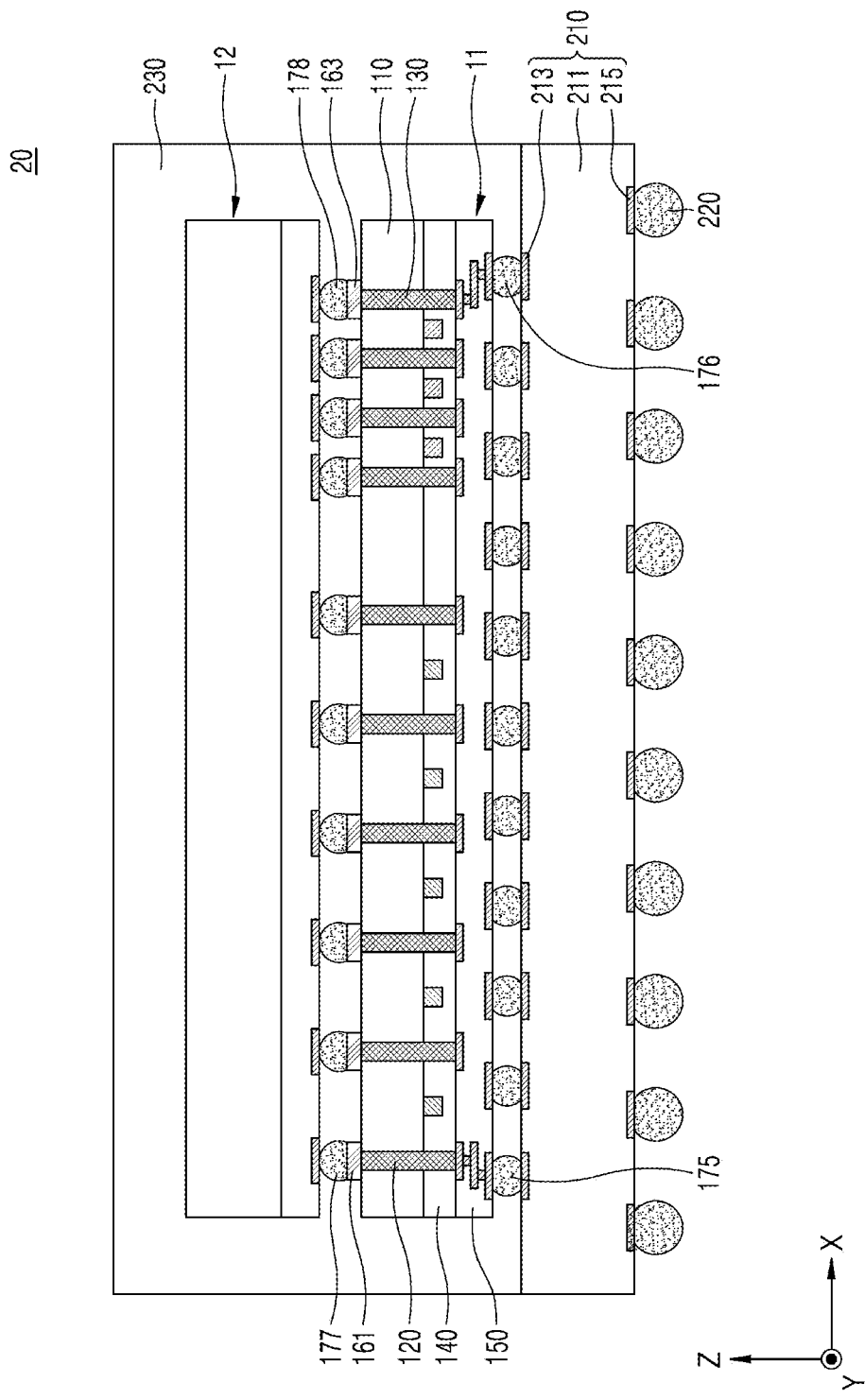
FIG. 7 is a cross-sectional view of a semiconductor package according to example embodiments of inventive concepts.

FIG. 7 is a cross-sectional view of a semiconductor package 20 according to example embodiments of inventive concepts.

Referring to FIG. 7, the semiconductor package 20 may include a package substrate 210 and at least one integrated circuit device mounted on the package substrate 210. For example, the semiconductor package 20 may include a first integrated circuit device 11 mounted on the package substrate 210 and a second integrated circuit device 12 mounted on the first integrated circuit device 11.

FIG. 7 illustrates the semiconductor package 20, in which two integrated circuit devices are mounted on the package substrate 210. However, inventive concepts is not limited thereto. For example, three or more integrated circuit devices may be mounted on the package substrate 210. For example, three or more integrated circuit devices may be stacked on the package substrate 210 in a vertical direction. For convenience, FIG. 7 briefly illustrates the semiconductor package 20 by omitting one or more components of each of the first and second integrated circuit devices 11 and 12. FIG. 7 illustrates that the first integrated circuit device 11 corresponds to the integrated circuit device 10a described with reference to FIG. 3. However, the first integrated circuit device 11 may correspond to at least one of the integrated circuit devices 10, 10b, 10c, and 10d described with reference to FIGS. 1, 2, and 4 through 6.

In some example embodiments, a plurality of integrated circuit devices stacked in the vertical direction may include homogeneous semiconductor chips. For example, the plurality of integrated circuit devices stacked in the vertical direction may include a stack-type memory device realized based on the high bandwidth memory (HBM) standards or hybrid memory cube (HMC) standards.

In some example embodiments, the plurality of integrated circuit devices stacked in the vertical direction may include heterogeneous semiconductor chips. For example, the plurality of integrated circuit devices stacked in the vertical direction may include a semiconductor structure having a 3D-CIS stack structure including a logic chip, a memory chip, and an image sensor chip.

The package substrate 210 may include, for example, a printed circuit board. For example, the package substrate 210 may include a multi-layered printed circuit board. The package substrate 210 may include a substrate base 211, substrate upper pads 213 arranged on an upper surface of the substrate base 211 and substrate lower pads 215 arranged on a lower surface of the substrate base 211. The substrate base 211 may include at least one material selected from phenol resins, epoxy resins, and polyimide. External connection terminals 220 configured to electrically connect an external device with the semiconductor package 20 may be arranged on the substrate lower pads 215. The external connection terminals 220 may include, for example, a solder ball. The first lower connection bumps 175 electrically connected to the first TSV structures 120 or the second lower connection bumps 176 electrically connected to the second TSV structures 130 may be arranged on the substrate upper pads 213.

According to example embodiments of inventive concepts, a distance between the first lower connection bumps 175 and a distance between the second lower connection bumps 176 may be the same as each other.

The second integrated circuit device 12 may be mounted on the first integrated circuit device 11 to be electrically connected to the first TSV structures 120 and the second TSV structures 130. Connection bumps, which are connecting structures to electrically/physically connect the second integrated circuit device 12 with the first integrated circuit device 11, may be arranged between the second integrated circuit device 12 and the first integrated circuit device 11. For example, first upper connection bumps 177 connected to the first upper connection pads 161 and second upper connection bumps 178 connected to the second upper connection pads 163 may be arranged between the second integrated circuit device 12 and the first integrated circuit device 11. For example, a circuit portion of the second integrated circuit device 12 may be electrically connected to the first TSV structures 120 through the first upper connection bumps 177, and another circuit portion of the second integrated circuit device 12 may be electrically connected to the second TSV structures 130 through the second upper connection bumps 178.

According to example embodiments, a distance between the second upper connection bumps 178 may be less than a distance between the first upper connection bumps 177. For example, the distance between the first upper connection bumps 177 may be substantially the same as the distance between the first TSV structures 120, and the distance between the second upper connection bumps 178 may be substantially the same as the distance between the second TSV structures 130.

Electrical connection between the second integrated circuit device 12 and the package substrate 210 may be formed through an electrical connection path through the first lower connection bump 175, the first TSV structure 120, and the first upper connection bump 177, and/or an electrical connection path through the second lower connection bump 176, the second TSV structure 130, and the second upper connection bump 178. Also, electrical connection between the second integrated circuit device 12 and the first integrated circuit device 11 may be formed through an electrical connection path through the first TSV structure 120 and the first upper connection bump 177, and/or an electrical connection path through the second TSV structure 130 and the second upper connection bump 178.

The semiconductor package 20 may include a molding layer 230 arranged on the package substrate 210 and molding the first integrated circuit device 11 and the second integrated circuit device 12. According to example embodiments, the molding layer 230 may include an insulating polymer or epoxy resins. For example, the molding layer 230 may include an epoxy mold compound (EMC).

Figure 8:
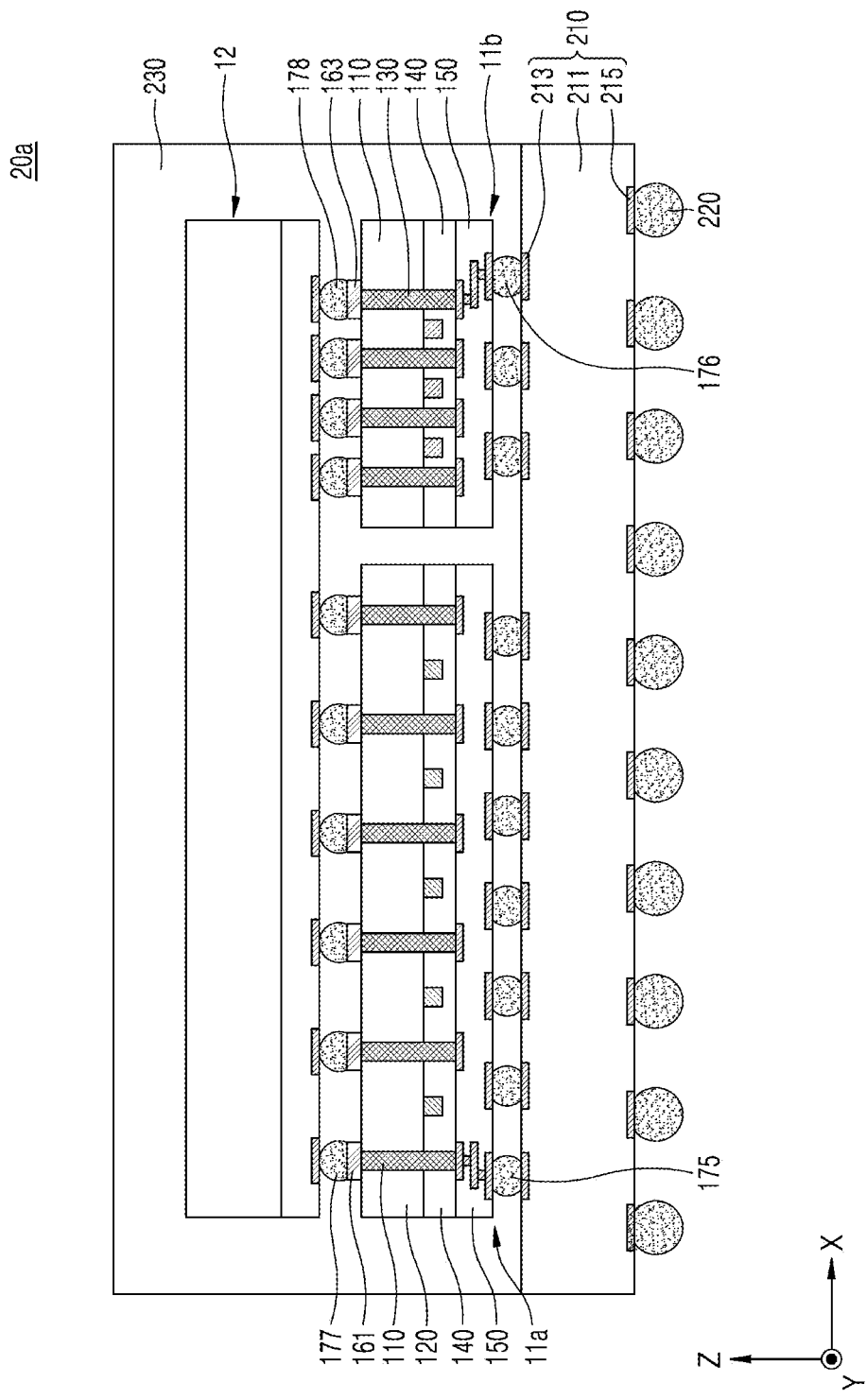
FIG. 8 is a cross-sectional view of a semiconductor package according to example embodiments of inventive concepts.

FIG. 8 is a cross-sectional view of a semiconductor package 20a according to example embodiments of inventive concepts. Hereinafter, descriptions will be given based on aspects of the semiconductor package 20a, which are different from the aspects of the semiconductor package 20 described with reference to FIG. 7.

Referring to FIG. 8, the semiconductor package 20a may include the package substrate 210, a first sub-integrated circuit device 11a and a second sub-integrated circuit device 11b arranged on the package substrate 210 to be apart from each other in a horizontal direction, and the second integrated circuit device 12 mounted on the first and second sub-integrated circuit devices 11a and 11b. In FIG. 8, the first sub-integrated circuit device 11a may be substantially the same as or similar to a structure, in which a portion of the first integrated circuit device 11, the portion including the first TSV region (R1 of FIG. 1) in which the first TSV structures 120 are arranged, is separated, and the second sub-integrated circuit device 11b may be substantially the same as or similar to a structure, in which a portion of the first integrated circuit device 11, the portion including the second TSV region (R2 of FIG. 1) in which the second TSV 130 structures are arranged, is separated.

The second integrated circuit device 12 may overlap at least a portion of the first sub-integrated circuit device 11a and at least a portion of the second sub-integrated circuit device 11b in a vertical direction. The second integrated circuit device 12 may be electrically connected to the first TSV structures 120 of the first sub-integrated circuit device 11a and the second TSV structures 130 of the second sub-integrated circuit device 11b.

The first sub-integrated circuit device 11a and the second sub-integrated circuit device 11b may be electrically connected to each other through the package substrate 210.

In FIG. 8, one first sub-integrated circuit device 11a and one second sub-integrated circuit device 11b are arranged on the package substrate 210. However, inventive concepts is not limited thereto. For example, two or more second sub-integrated circuit devices 11b may be arranged around the first sub-integrated circuit device 11a.

Figure 9:
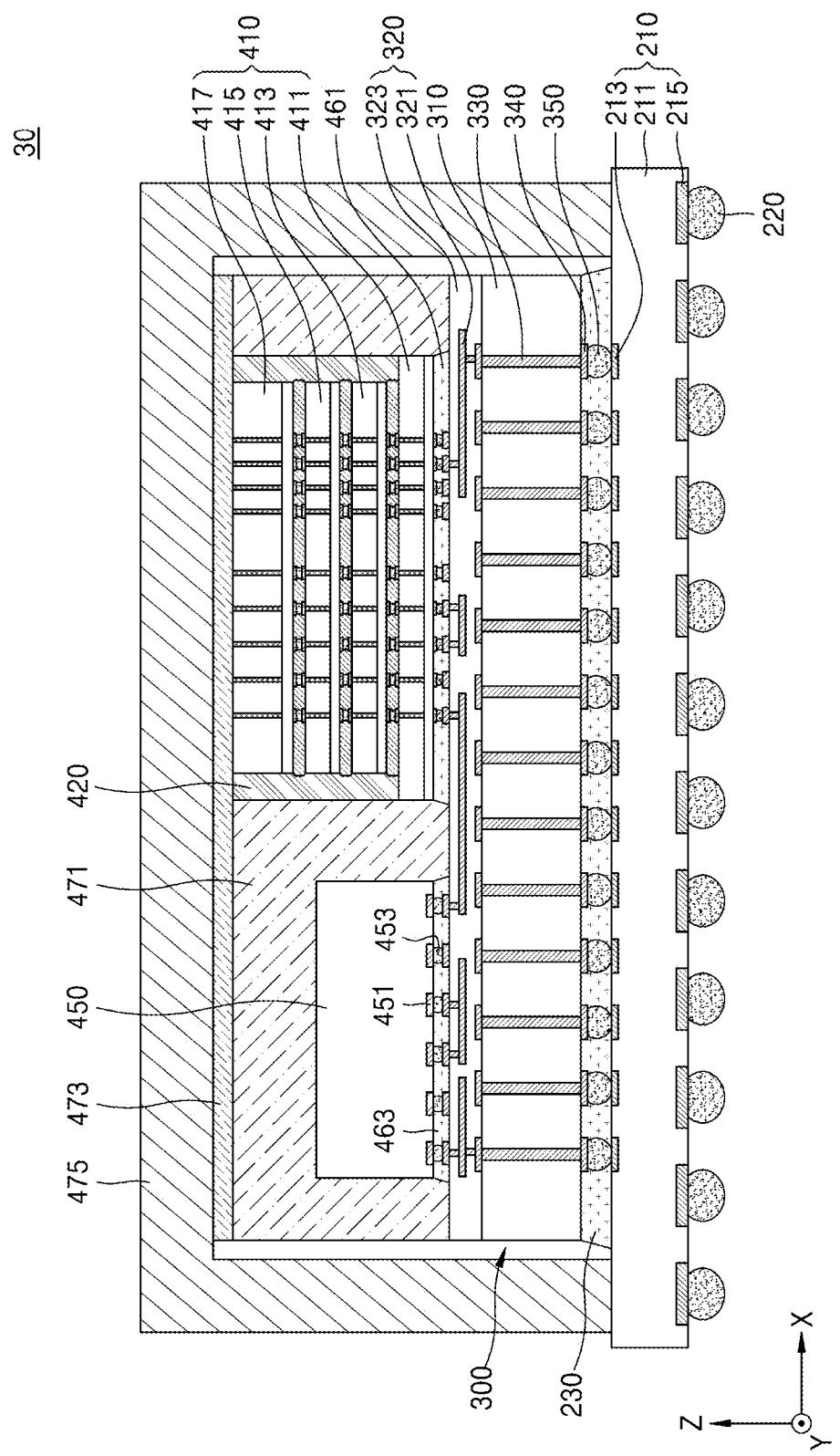
FIG. 9 is a cross-sectional view of a semiconductor package according to example embodiments of inventive concepts.

FIG. 9 is a cross-sectional view of a semiconductor package 30 according to example embodiments of inventive concepts.

Referring to FIG. 9, the semiconductor package 30 may include the package substrate 210, an interposer 300 mounted on the package substrate 210, a first semiconductor device 410 and a second semiconductor device 450 mounted on the interposer 300.

The interposer 300 may include a base layer 310, an interposer redistribution structure 320, and an interposer through-electrode 330.

The base layer 310 may include a semiconductor material, glass, ceramics, or plastic. According to example embodiments, the base layer 310 may include a Si wafer including Si, for example, crystalline Si, polycrystalline Si, or amorphous Si.

The interposer redistribution structure 320 may include a redistribution insulating layer 323 covering an upper surface of the base layer 310, and a conductive redistribution pattern 321 coated with the redistribution insulating layer 323. The conductive redistribution pattern 321 may include, for example, a plurality of interconnect layers forming a multi-layered structure and conductive vias extending in a vertical direction to electrically connect the plurality of interconnect layers with each other. One or more of the plurality of interconnect layers may be formed on the upper surface of the base layer 310 to form a pad connected to the interposer through-electrode 330. Also, the other one or more of the plurality of interconnect layers may form a pad connected to a connection bump for electrical connection with the first and second semiconductor devices 410 and 450 arranged above the redistribution insulating layer 323 and mounted on the interposer 300.

The interposer through-electrode 330 may extend from the upper surface of the base layer 310 to a lower surface thereof, so as to penetrate the base layer 310. The interposer through-electrode 330 may electrically connect the conductive redistribution pattern 321 of the interposer redistribution structure 320 with a lower connection pad 340 arranged on the lower surface of the base layer 310. A connection terminal 350 between a board and an interposer may be arranged on the lower connection pad 340.

The first semiconductor device 410 may include a plurality of integrated circuit devices stacked in the vertical direction. For example, the first semiconductor device 410 may include first through fourth integrated circuit devices 411, 413, 415, and 417 stacked in the vertical direction.

Each of the first through fourth integrated circuit devices 411, 413, 415, and 417 included in the first semiconductor device 410 may be substantially the same as or similar to at least one of the integrated circuit devices 10, 10a, 10b, 10c, and 10d described with reference to FIGS. 1 through 6. For convenience, FIG. 9 briefly illustrates the first semiconductor device 410 by omitting one or more components of each of the first through fourth integrated circuit devices 411, 413, 415, and 417.

According to example embodiments, the first semiconductor device 410 may include a stack-type memory device. For example, the first semiconductor device 410 may have a three-dimensional memory structure in which a plurality of chips are stacked. For example, the first semiconductor device 410 may be realized based on the HBM standards or the HMC standards. In this case, the first integrated circuit device 411 located as a lowermost layer may function as a buffer die, and the second through fourth integrated circuit devices 413, 415, and 417 may function as core dies. For example, the buffer die may also be referred to as an interface die, a base die, a logic die, a master die, and the like, and the core die may also be referred to as a memory die, a slave die, and the like. FIG. 9 illustrates that the first semiconductor device 410 includes three core dies. However, the number of core dies may be variously modified. For example, the first semiconductor device 410 may include four, eight, twelve, or sixteen core dies.

The second semiconductor device 450 may include processing circuitry such as hardware including logic circuits; a hardware/software combination such as a processor executing software; or a combination thereof. For example, the second semiconductor device 450 may include a system on chip (SoC), a central processing unit (CPU) chip, a graphics processing unit (GPU) chip, or an application processor (AP) chip. The second semiconductor device 450 may execute applications supported by the semiconductor package 30 by using the first semiconductor device 410. For example, the second semiconductor device 450 may perform specialized calculations by including at least one processor from among a CPU, an AP, a GPU, a neural processing unit (NPU), a tensor processing unit (TPU), a vision processing unit (VPU), an image signal processor (ISP), and a digital signal processor (DSP).

The first semiconductor device 410 and the second semiconductor device 450 may be mounted on the interposer redistribution structure 320 of the interposer 300 to be apart from each other in a horizontal direction. The first semiconductor device 410 and the second semiconductor device 450 may be electrically connected to each other through the conductive redistribution pattern 321 of the interposer redistribution structure 320. The first semiconductor device 410 may be mounted on the interposer 300 through a first connection bump 160 arranged on a lower surface of the first semiconductor device 410, and the second semiconductor device 450 may be mounted on the interposer 300 through a chip connection bump 453 mounted on a pad 451 of the second semiconductor device 450. A first underfill material layer 461 wrapping the first connection bump 160 may be arranged between the first semiconductor device 410 and the interposer 300, and a second underfill material layer 463 wrapping the chip connection bump 453 may be arranged between the second semiconductor device 450 and the interposer 300.

FIG. 9 illustrates an example in which two semiconductor devices are mounted on the interposer 300. However, the semiconductor package 30 may include three or more semiconductor devices arranged on the interposer 300.

The semiconductor package 30 may further include a package molding layer 471 arranged on the interposer 300 and molding the first and second semiconductor devices 410 and 450. The packaging molding layer 471 may include, for example, an EMC. According to example embodiments, the package molding layer 471 may cover an upper surface of the interposer 300, a side wall of the first semiconductor device 410, and a side wall of the second semiconductor device 450, but may not cover an upper surface of the first semiconductor device 410.

The semiconductor package 30 may further include a heat radiation member 475 covering the upper surface of the first semiconductor device 410 and an upper surface of the second semiconductor device 450. The heat radiation member 475 may include a heat radiation plate, such as a heat slug or a heat sink. According to example embodiments, the heat radiation member 475 may encircle the first semiconductor device 450, and the interposer 300 on an upper surface of the package substrate 210.

Also, the semiconductor package 30 may further include a thermal interface material (TIM) 473. The TIM 473 may be arranged between the heat radiation member 475 and the first semiconductor device 410 and between the heat radiation member 475 and the second semiconductor device 450.

The package substrate 210 may be electrically connected to the interposer 300 through the connection terminal 350 between the board and the interposer. An underfill material layer 230 may be arranged between the interposer 300 and the package substrate 210. The underfill material layer 230 may wrap the connection terminals 350 between the boards and the interposers.

According to example embodiments of inventive concepts, each of the first through fourth integrated circuit devices 411, 413, 416, and 417 included in the first semiconductor device 410 may include TSV structures arranged by having a very small distance between each other in a desired and/or alternatively predetermined region in which there is no device affected by stress operating around the TSV structures or a device having almost no effect from the stress is arranged. Accordingly, the first semiconductor device 410 may have a small form factor while including the required number of TSV structures, and the semiconductor package 30 including the first semiconductor device 410 may have a small form factor.

FIGS. 10A through 10K are cross-sectional views for describing a method of manufacturing an integrated circuit device, according to example embodiments of inventive concepts. Hereinafter, a method of manufacturing the integrated circuit device 10a illustrated in FIG. 3 will be described by referring to FIGS. 10A through 10K.

Figure 10A:
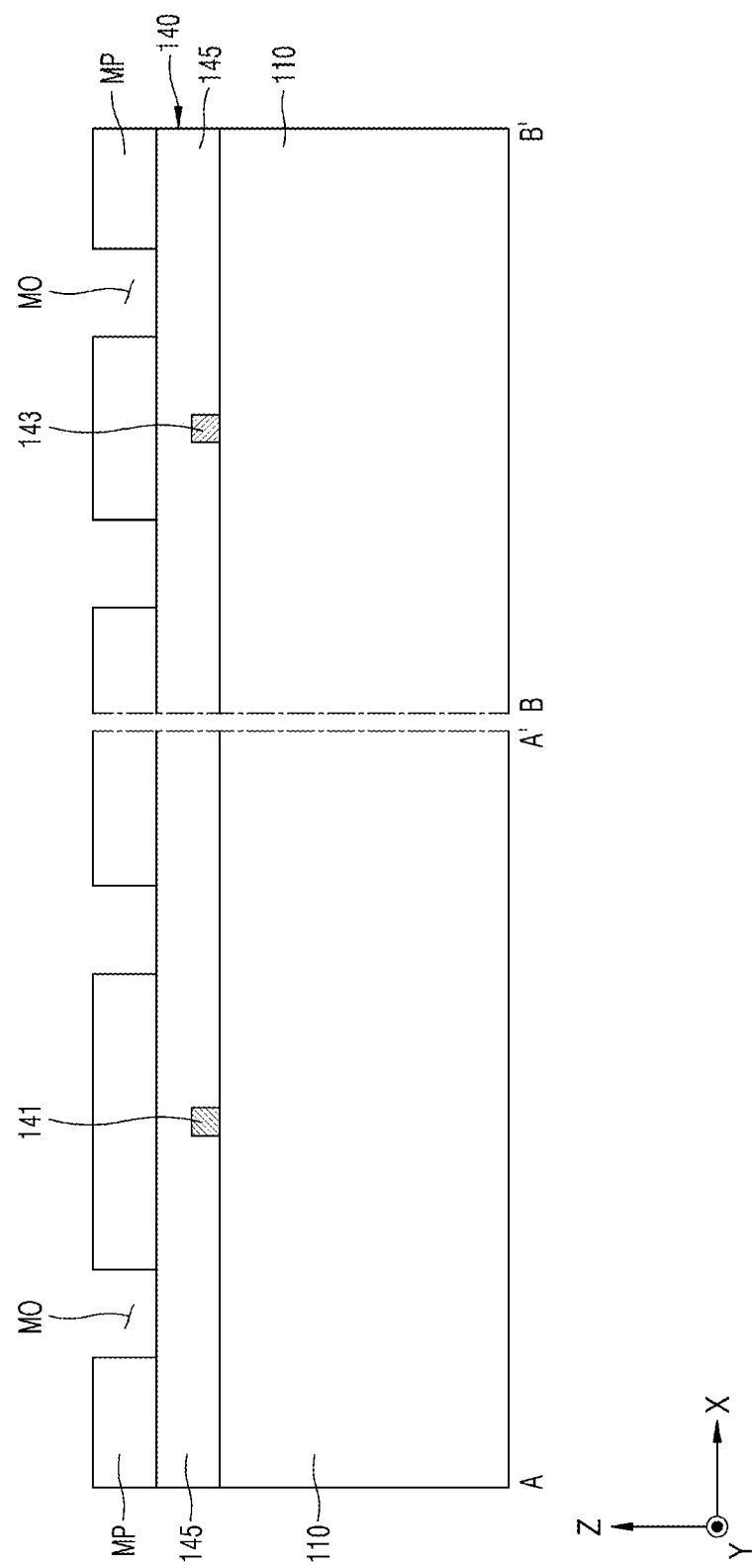
FIGS. 10A through 10K are cross-sectional views for describing a method of manufacturing an integrated circuit device, according to example embodiments of inventive concepts.

Referring to FIG. 10A, the FEOL structure 140 may be formed on the semiconductor substrate 110, and a mask pattern MP may be formed on the FEOL structure 140. A mask opening MO exposing a portion of an upper surface of the FEOL structure 140 may be formed in the mask pattern MP. The mask pattern MP may include, for example, a photoresist.

Figure 10B:
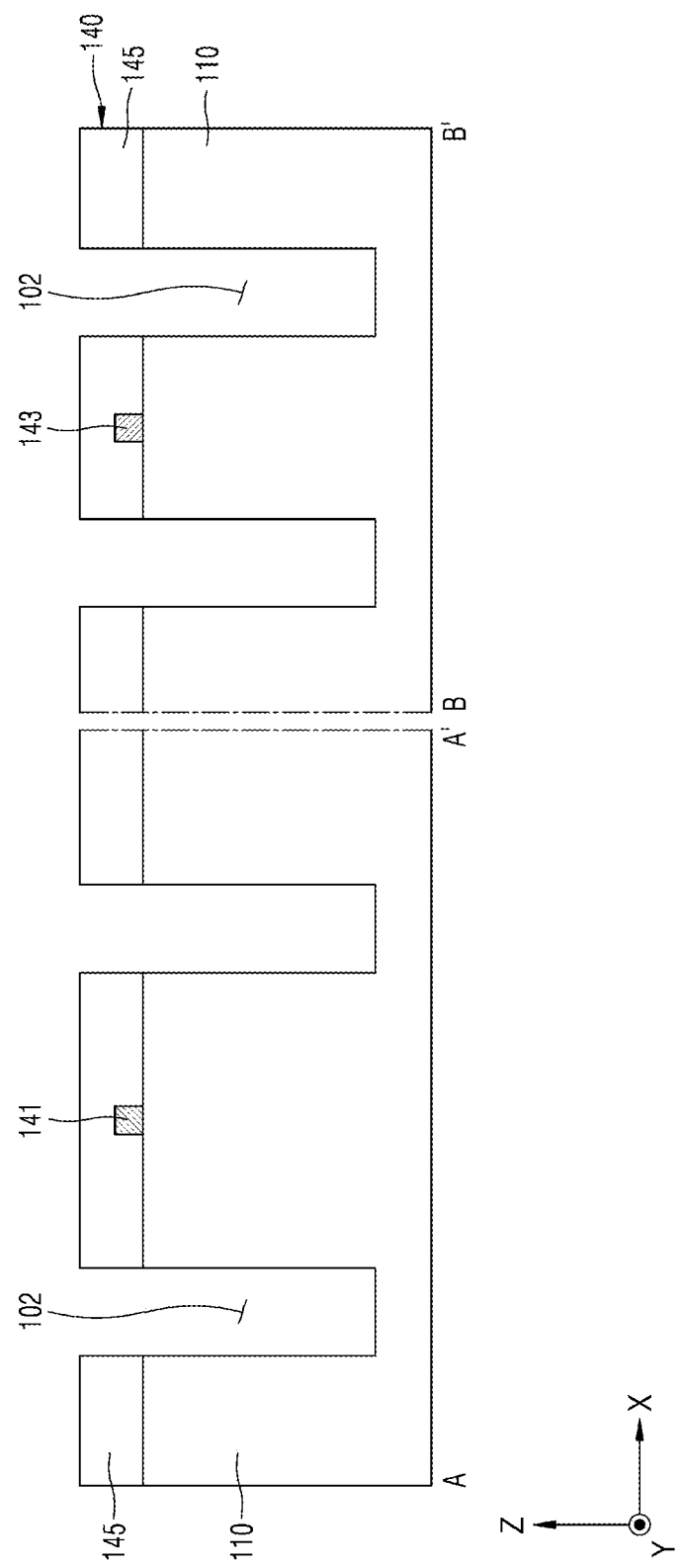

Referring to FIGS. 10A and 10B, the mask pattern MP may be used as an etch mask to etch the interlayer insulating layer 145 and then to etch the semiconductor substrate 110 to form via holes 102. Each of the via holes 102 may include a lower portion having a shape partially penetrating the semiconductor substrate 110 and an upper portion having a shape penetrating the interlayer insulating layer 145. It is described that the via holes 102 are formed by an etch process. However, it is not limited thereto, and the via holes 102 may be formed by a laser drilling process.

According to example embodiments, the semiconductor substrate 110 may include a first TSV region and a second TSV region apart from each other, and the plurality of via holes 102 may be formed in each of the first TSV region and the second TSV region. Here, a distance between the via holes 102 in the first TSV region may be greater than a distance between the via holes 102 in the second TSV region.

After the via holes 102 are formed, the mask pattern MP may be removed.

Figure 10C:
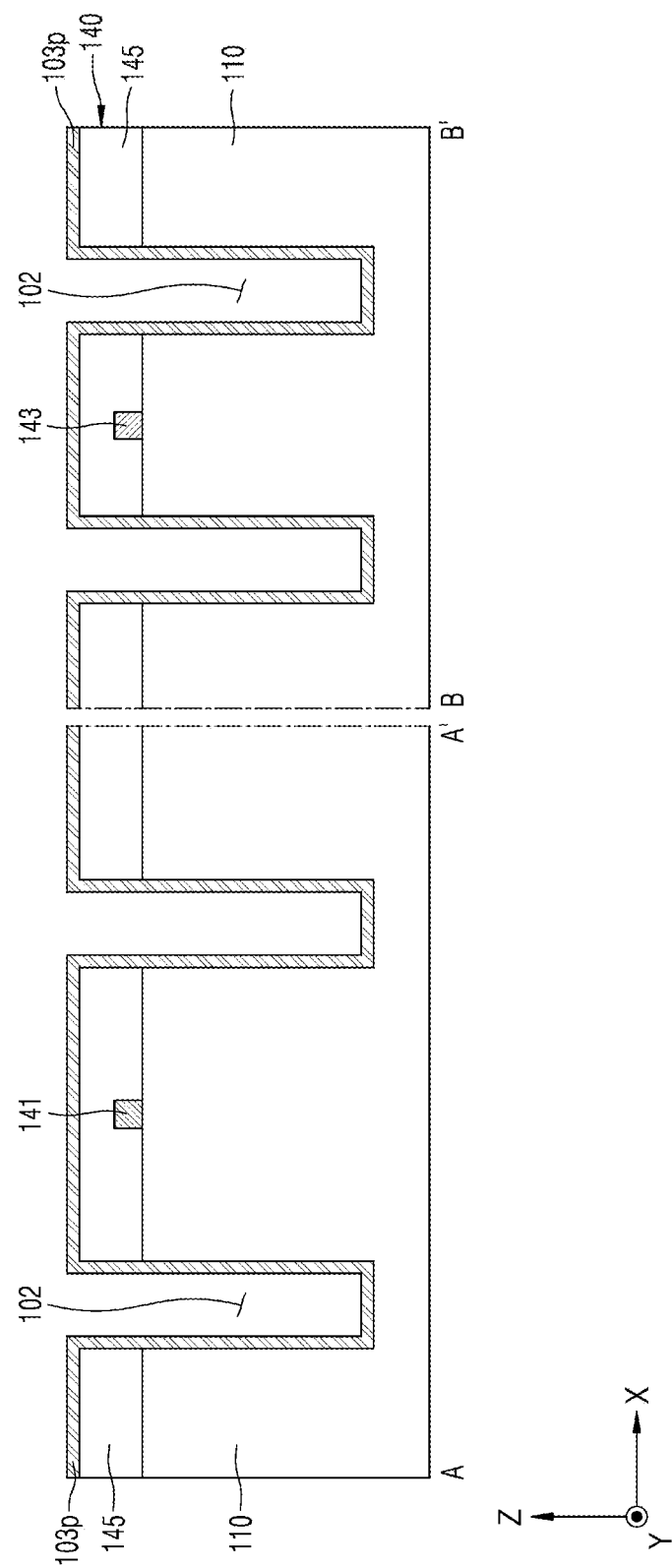

Referring to FIG. 10C, a preliminary via insulating layer 103p covering an inner side wall and a lower surface of each of the via holes 102 may be formed. The preliminary via insulating layer 103p may be formed to cover a surface of the semiconductor substrate 110 and a surface of the interlayer insulating layer 145, the surfaces being exposed through the via holes 102, and may be formed to cover an upper surface of the interlayer insulating layer 145.

Figure 10D:
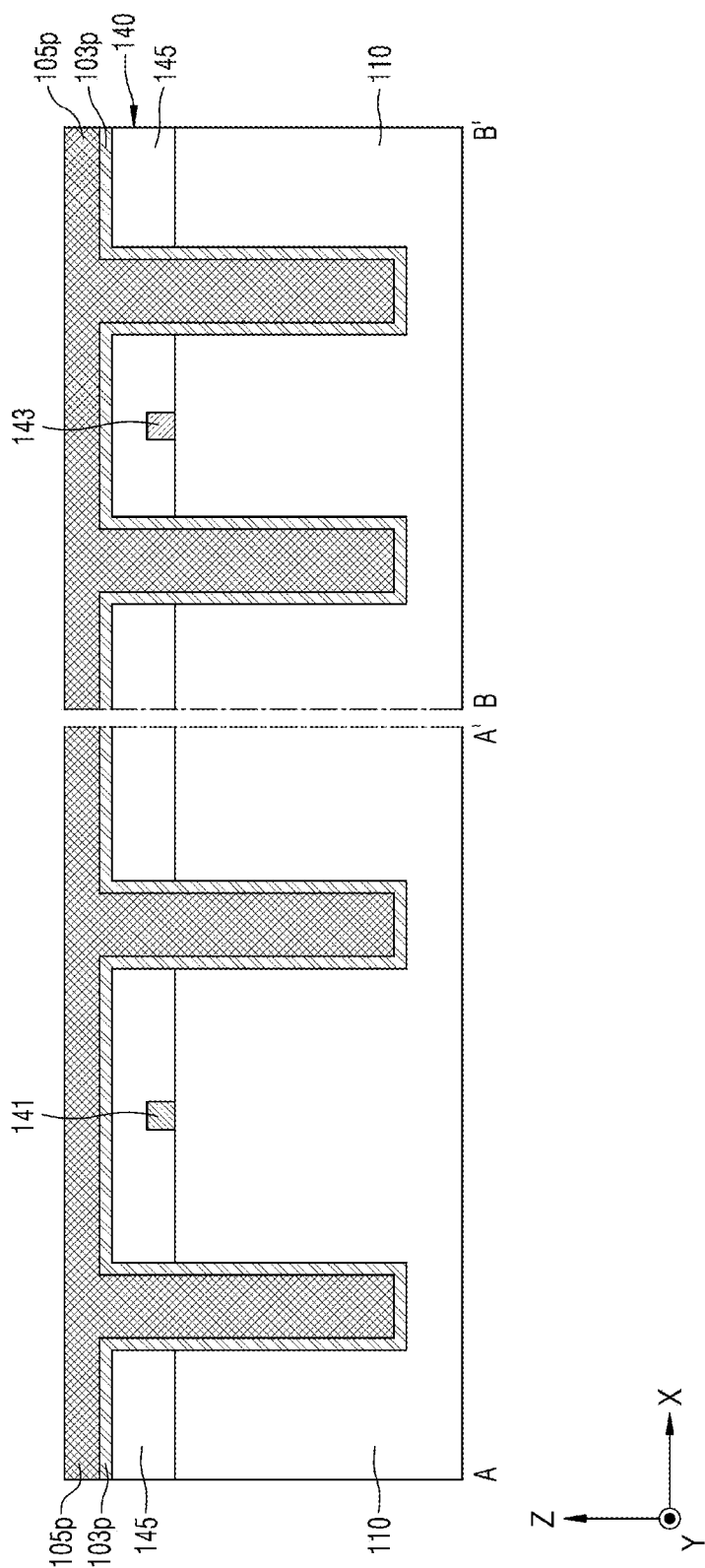

Referring to FIG. 10D, a conductive material layer 105p may be formed on the preliminary via insulating layer 103p. The conductive material layer 105p may include, for example, a preliminary conductive barrier layer and a preliminary metal layer sequentially formed on the preliminary via insulating layer 103p. The preliminary conductive barrier layer may be formed, for example, by a physical vapor deposition (PVD) process or a chemical vapor deposition (CVD) process, and may be conformally formed along a surface of the preliminary via insulating layer 103p. The preliminary metal layer may be formed, for example, by a plating process, to fill the via holes (102 of FIG. 10C).

Figure 10E:
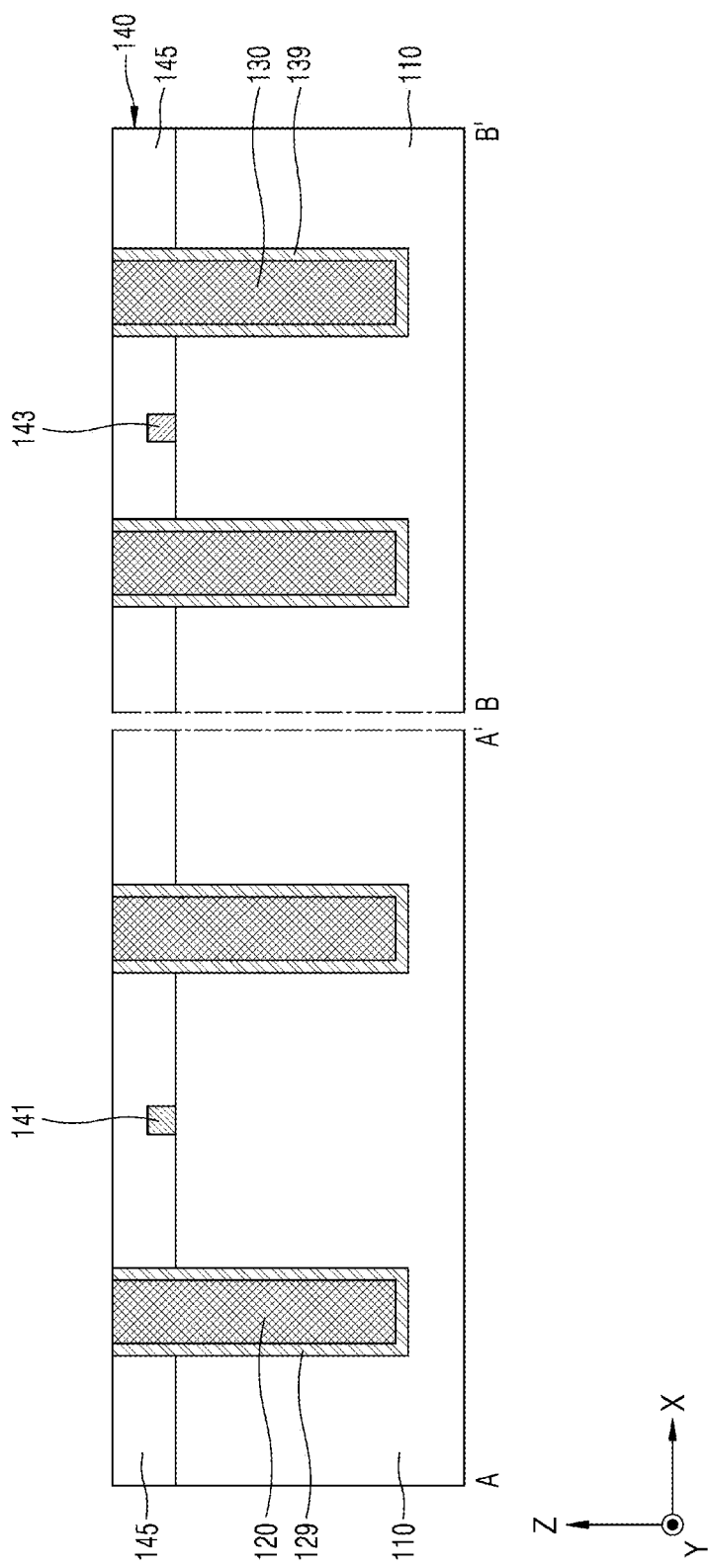

Referring to FIGS. 10D and 10E, a polishing process, for example, a chemical mechanical polishing process, may be performed on a structure manufactured according to the process of FIG. 10D. Through the polishing process, a portion of the conductive material layer 105p and a portion of the preliminary via insulating layer 103p, the portions covering the upper surface of the interlayer insulating layer 145, may be removed, and the other portion of the conductive material layer 105p and the other portion of the preliminary via insulating layer 103p, the other portions being formed in the via holes (102 of FIG. 10C), may remain. After performing the polishing process, the first TSV structures 120 may be formed in the via holes 102 in the first TSV region of the semiconductor substrate 110, and the second TSV structures 130 may be formed in the via holes 102 in the second TSV region of the semiconductor substrate 110.

Figure 10F:
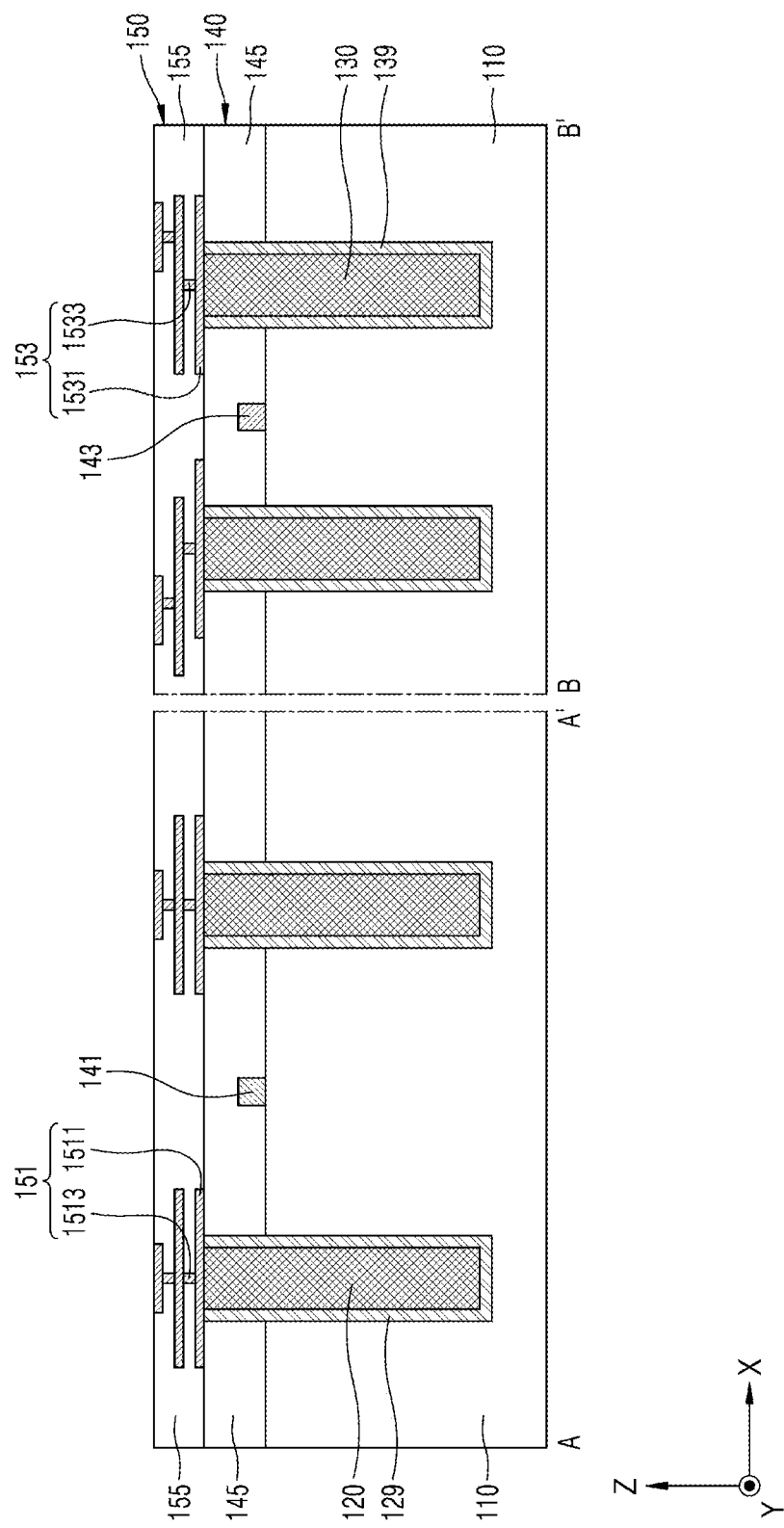

Referring to FIG. 10F, the BEOL structure 150 may be formed on the FEOL structure 140. The BEOL structure 150 may include the metal interlayer insulating layer 155 including a plurality of sub-insulating layers sequentially stacked on the FEOL structure 140, and a multi-layer interconnect structures insulated by the metal interlayer insulating layer 155. In order to form the BEOL structure 150, an operation of forming a sub-insulating layer including a hole for a metal interconnection and an operation of forming a sub-metal layer filling the hole for the metal interconnection of the sub-insulating layer may be repeatedly performed a number of times. Sub-metal layers formed to fill the hole for the metal interconnection of each of the plurality of sub-insulating layers may be included in the metal interconnect layers 1511 or the contact plugs 1513 of the first multi-layer interconnect structure 151, the metal interconnect layers 1531 or the contact plugs 1533 of the second multi-layer interconnect structure 153, a first connection pad 171, or a second connection pad 173.

Figure 10G:
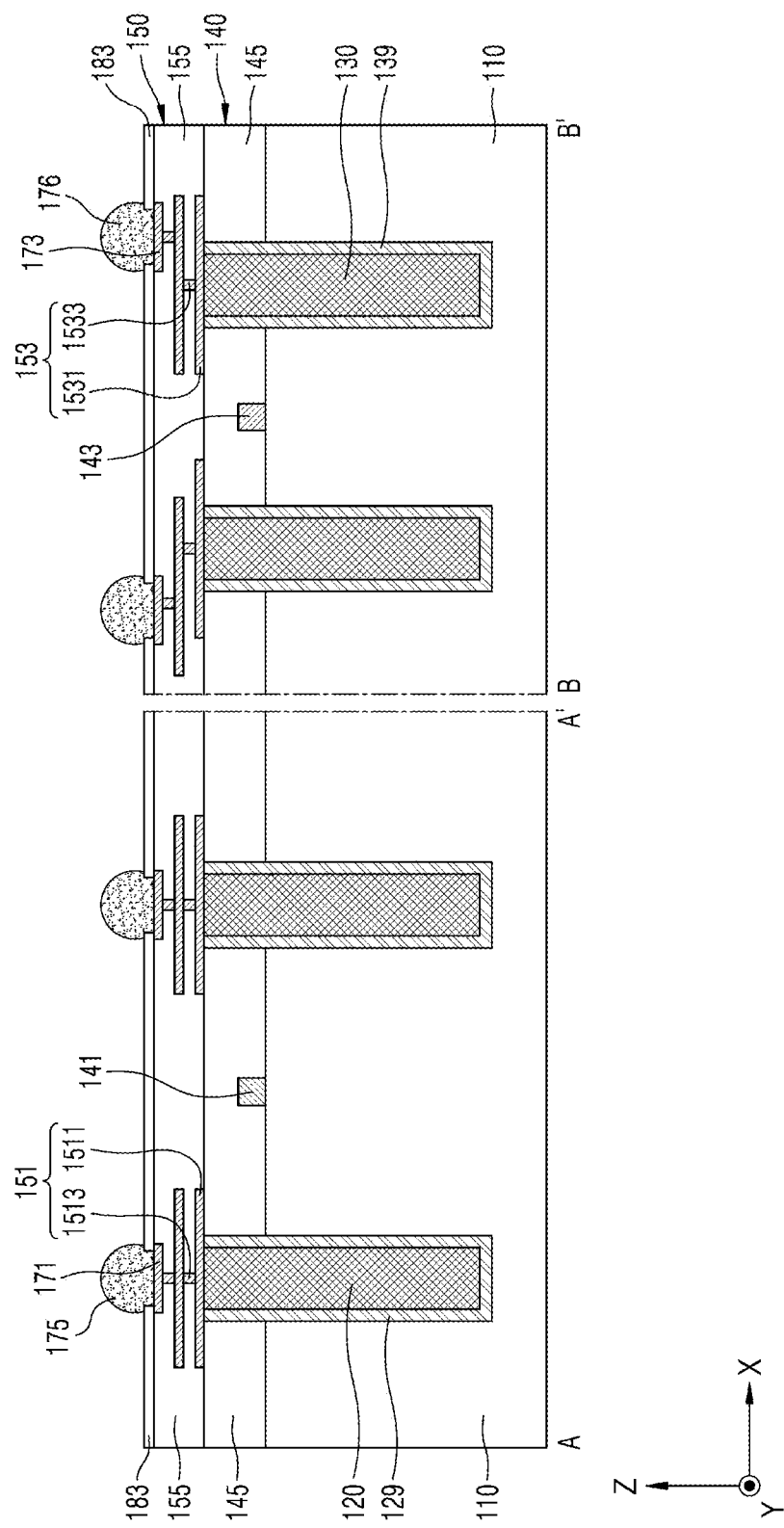

Referring to FIG. 10G, after the lower protection layer 183 including a first opening exposing the first connection pad 171 and a second opening exposing the second connection pad 173 is formed on the BEOL structure 150, the first lower connection bump 175 connected to the first connection pad 171 through the first opening and the second lower connection bump 176 connected to the second connection pad 173 through the second opening may be formed.

Figure 10H:
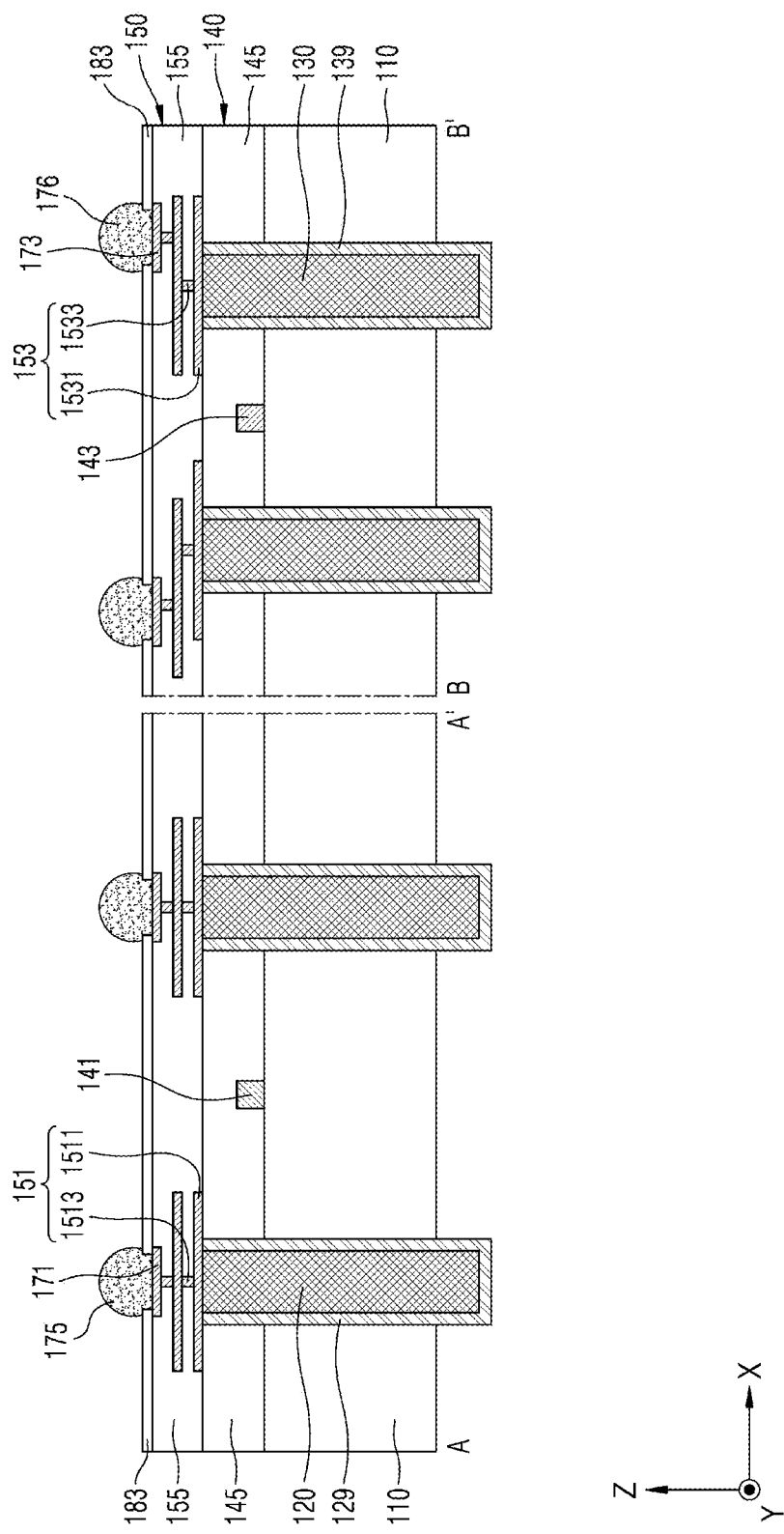

Referring to FIG. 10H, by partially removing the semiconductor substrate 110 from a lower surface of the semiconductor substrate 110, the first TSV structure 120 surrounded by the first via insulating layer 129 and the second TSV structure 130 surrounded by the second via insulating layer 139 may be formed to protrude from the lower surface of the semiconductor substrate 110.

Figure 10I:
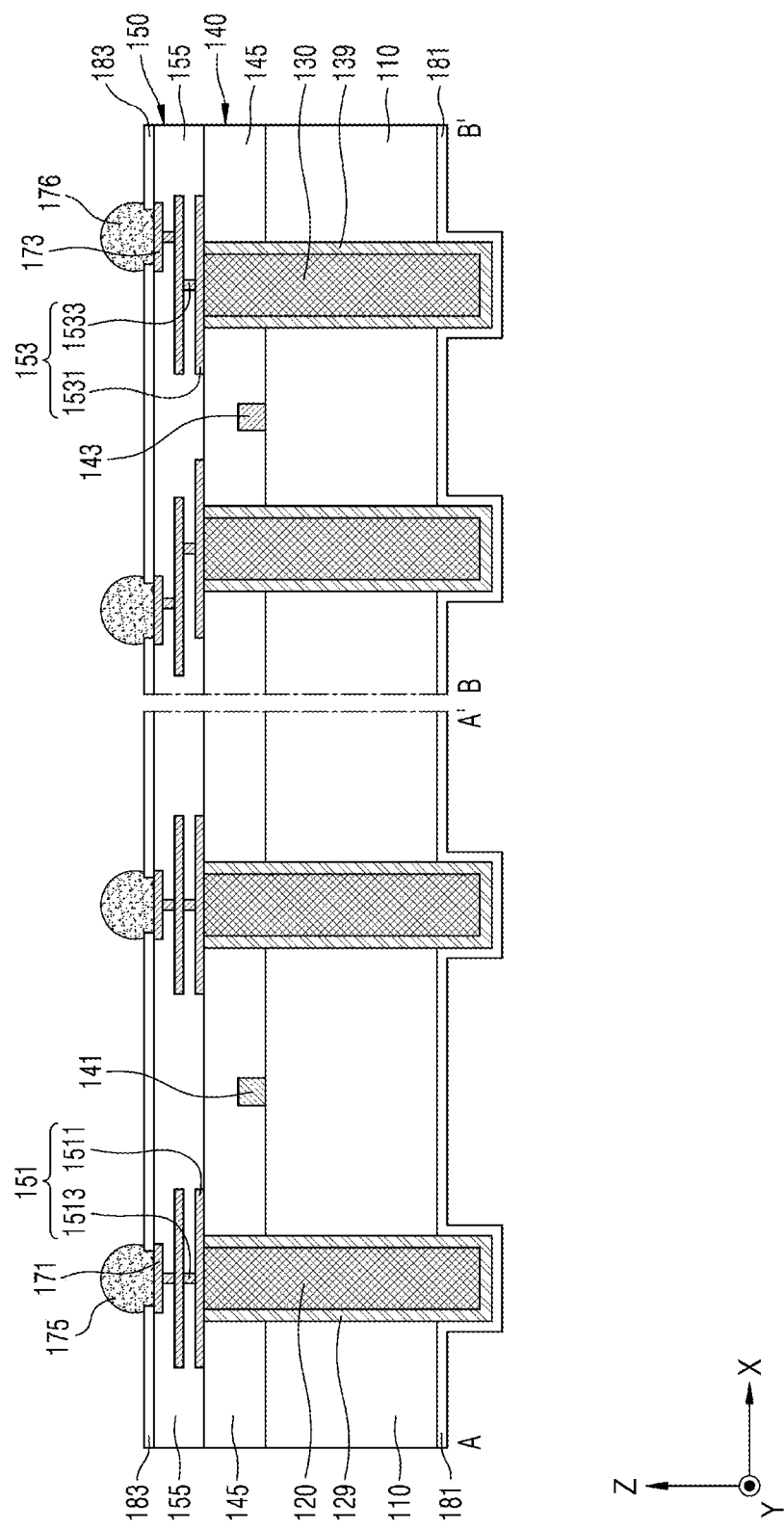

Referring to FIG. 10I, the upper protection layer 181 covering the lower surface of the semiconductor substrate 110 may be formed. The upper protection layer 181 may be formed to cover the first via insulating layer 129 and the second via insulating layer 139 protruding from the lower surface of the semiconductor substrate 110.

Figure 10J:
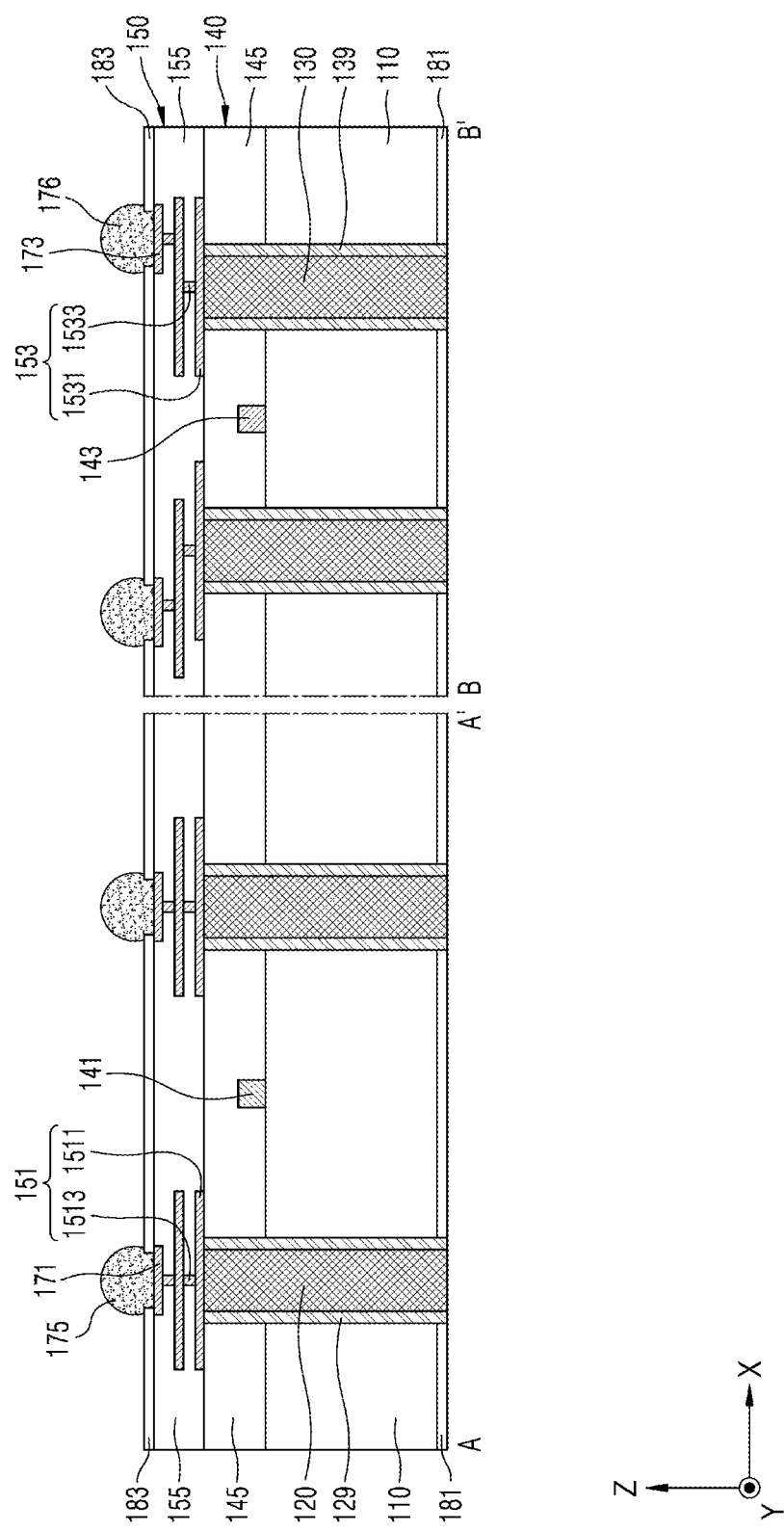

Referring to FIG. 10J, until a planarized surface is formed on the lower surface of the semiconductor substrate 110, a polishing process may be performed from an exposed surface of the upper protection layer 181. Through the polishing process, a lower surface of the first TSV structure 120 and a lower surface of the second TSV structure 130, the lower surfaces of the first and second TSV structures 120 and 130 being planarized at the lower surface of the semiconductor substrate 110, may be exposed.

Figure 10K:
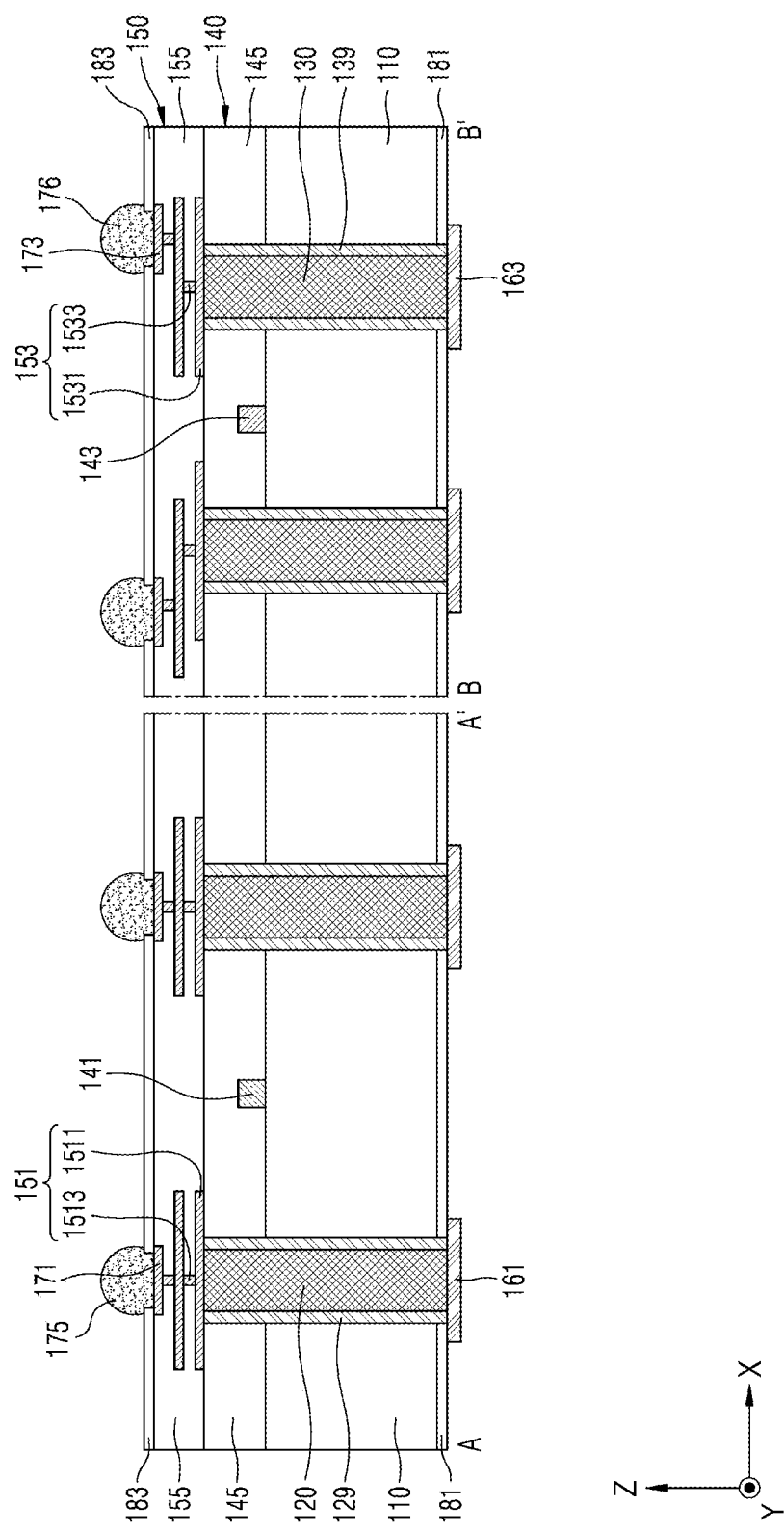

Referring to FIG. 10K, the first upper connection pad 161 connected to the exposed lower surface of the first TSV structure 120 and the second upper connection pad 163 connected to the exposed lower surface of the second TSV structure 130 may be formed.

While inventive concepts has been particularly shown and described with reference to embodiments thereof, it will be understood that various changes in form and details may be made therein without departing from the spirit and scope of the following claims.

What is claimed is:

1. An integrated circuit device comprising:
a semiconductor substrate;
first through-silicon-via (TSV) structures penetrating a first TSV region of the semiconductor substrate, the first TSV structures being spaced apart from each other by a first pitch;
a first individual device between the first TSV structures, the first individual device being spaced apart from the first TSV structures by a distance that is greater than a first keep-off distance; and
second TSV structures penetrating a second TSV region of the semiconductor substrate, the second TSV structure being spaced apart from each other by a second pitch that is less than the first pitch,
wherein an individual device is not arranged between the second TSV structures in the second TSV region of the semiconductor substrate.

2. The integrated circuit device of claim 1, wherein
the first TSV region of the semiconductor substrate includes a keep-off zone within the first keep-off distance from the first TSV structures, and
the keep-off zone is defined as a region in which a property change is greater than a threshold value for the first individual device, the property change being caused by stress occurring around the first TSV structures in response a voltage being applied to the first TSV structures.

3. The integrated circuit device of claim 2, wherein
a distance between adjacent first TSV structures, among the first TSV structures, being greater than twice the first keep-off distance, and
a distance between adjacent second TSV structures, among the second TSV structure, being equal to or less than twice the first keep-off distance.

4. The integrated circuit device of claim 1, wherein the first individual device includes an active device.

5. The integrated circuit device of claim 1, wherein the first TSV structures and the second TSV structures have a same diameter.

6. The integrated circuit device of claim 1, wherein the first TSV structures and the second TSV structures have a same aspect ratio.

7. The integrated circuit device of claim 1, wherein the second pitch is equal to or less than about 15 μm.

8. The integrated circuit device of claim 1, wherein a distance between side walls of adjacent second TSV structures, among the second TSV structures, is between about 2 μm and about 11 μm.

9. The integrated circuit device of claim 1, further comprising:
first pads connected to the first TSV structures; and
second pads connected to the second TSV structures,
wherein a distance between adjacent first pads among the first pads is greater than a distance between adjacent second pads among the second pads.

10. The integrated circuit device of claim 1, further comprising:
a redistribution structure on the semiconductor substrate, the redistribution structure including a first redistribution pattern connected to the first TSV structures and a second redistribution pattern connected to the second TSV structures;
first pads on the redistribution structure and electrically connected to the first TSV structures through the first redistribution pattern; and
second pads on the redistribution structure and electrically connected to the second TSV structures through the second redistribution pattern,
wherein a distance between adjacent first pads among the first pads is equal to a distance between adjacent second pads among the second pads.

11. An integrated circuit device comprising:
a semiconductor substrate;
first through-silicon-via (TSV) structures penetrating a first TSV region of the semiconductor substrate, the first TSV structures being spaced apart from each other by a first pitch;
a first individual device between the first TSV structures, the first individual device being spaced apart from the first TSV structures by a distance that is greater than a first keep-off distance;
second TSV structures penetrating a second TSV region of the semiconductor substrate, the second TSV structure being spaced apart from each other by a second pitch that is less than the first pitch; and
a second individual device between the second TSV structures,
wherein the first individual device includes an active device and the second individual device includes a passive device.

12. The integrated circuit device of claim 11, wherein
the first TSV region of the semiconductor substrate includes a keep-off zone within the first keep-off distance from the first TSV structures,
the keep-off zone is defined as a region in which an property change is greater than a threshold value for the first individual device, the property change being caused by stress occurring around the first TSV structures in response a voltage being applied to the first TSV structures,
a distance between adjacent first TSV structures, among the first TSV structures, being greater than twice the first keep-off distance, and
a distance between adjacent second TSV structures, among the second TSV structure, being equal to or less than twice the first keep-off distance.

13. The integrated circuit device of claim 11, wherein the second pitch is equal to or less than about 15 μm, and
a distance between side walls of adjacent second TSV structures, among the second TSV structures, is between about 2 μm and about 11 μm.

14. The integrated circuit device of claim 11, wherein the first TSV structures and the second TSV structures have a same diameter, a diameter of each of the first TSV structures is between about 2 μm and about 6 μm.

15. The integrated circuit device of claim 11, wherein the first TSV structures and the second TSV structures have a same aspect ratio, an aspect ratio of each of the first TSV structures is between about 5 and about 20.

16. An integrated circuit device comprising:
a first through-silicon-via (TSV) region including first TSV structures and first individual devices, and
a second TSV region including second TSV structures,
wherein the first TSV region includes a keep-off zone defined as a region in which property changes of the first individual devices, caused by stress occurring around the first TSV structures in response to a voltage applied to the first TSV structures, are greater than a threshold value, the keep-off zone being within a first keep-off distance from a side wall of each of the first TSV structures,
a distance between adjacent first TSV structures, among the first TSV structures, being greater than twice the first keep-off distance, and
a distance between adjacent second TSV structures, among the second TSV structure, being equal to or less than twice the first keep-off distance.

17. The integrated circuit device of claim 16, wherein the second TSV region further includes second individual devices in the second TSV region, and the second individual devices are heterogeneous from the first individual devices.

18. The integrated circuit device of claim 17, wherein the first individual devices include an active device and the second individual devices include a passive device.

19. The integrated circuit device of claim 17, wherein the second individual devices are within the first keep-off distance from any one of the second TSV structures.

20. The integrated circuit device of claim 16, wherein the first TSV structures and the second TSV structures have a same diameter and a same aspect ratio.

* * * * *